United States Patent [19]

Shibata et al.

[11] Patent Number: 5,294,599
[45] Date of Patent: Mar. 15, 1994

[54] PROCESSES FOR PREPARING OXIDE POWDERS AND SUPERCONDUCTING OXIDES

[75] Inventors: Shuichi Shibata; Takeshi Kitagawa; Hisaaki Okazaki; Takao Kimura, all of Mito; Masaharu Horiguchi, Naka, all of Japan

[73] Assignee: Nippon Telegraph and Telephone Corporation, Tokyo, Japan

[21] Appl. No.: 313,965

[22] PCT Filed: Jun. 16, 1988

[86] PCT No.: PCT/JP88/00585

§ 371 Date: Feb. 15, 1989

§ 102(e) Date: Feb. 15, 1989

[87] PCT Pub. No.: WO88/10233

PCT Pub. Date: Dec. 29, 1988

[30] Foreign Application Priority Data

| Jun. 17, 1987 | [JP] | Japan | 62-150784 |
| Nov. 24, 1987 | [JP] | Japan | 62-293950 |
| Jan. 20, 1988 | [JP] | Japan | 63-8473 |
| Feb. 8, 1988 | [JP] | Japan | 63-25605 |
| Jun. 3, 1988 | [JP] | Japan | 63-135653 |
| Jun. 3, 1988 | [JP] | Japan | 63-135654 |
| Jun. 3, 1988 | [JP] | Japan | 63-135655 |

[51] Int. Cl.$^5$ .............. H01B 12/06; H01L 39/12; C01G 3/00; C04B 41/89
[52] U.S. Cl. .................. 505/1; 505/735; 501/12; 264/56; 427/62; 427/126.3; 427/226
[58] Field of Search ............ 505/1, 735; 501/12; 264/56; 427/62, 126.3, 226

[56] References Cited

U.S. PATENT DOCUMENTS

| 4,608,215 | 8/1986 | Gonczy et al. | 501/12 |
| 4,764,357 | 8/1988 | Sherif et al. | 505/1 |
| 4,853,207 | 8/1989 | Wautier et al. | 501/12 |
| 4,902,655 | 2/1990 | Snyder et al. | 505/1 |
| 4,918,035 | 4/1990 | Inoue et al. | 423/593 |
| 4,920,093 | 4/1990 | Nonaka et al. | 505/1 |
| 4,950,643 | 8/1990 | Agostinelli et al. | 505/1 |
| 4,959,346 | 9/1990 | Mogro-Campero et al. | 505/1 |
| 5,106,828 | 4/1992 | Bhargava et al. | 505/735 |
| 5,135,907 | 8/1992 | Mazdiyasni et al. | 505/735 |

FOREIGN PATENT DOCUMENTS

| 0251432 | 1/1988 | European Pat. Off. . |
| 0280292 | 8/1988 | European Pat. Off. . |
| 88/08609 | 11/1988 | PCT Int'l Appl. . |

OTHER PUBLICATIONS

Zheng et al, "Superconducting $4Ba_2Cu_3O_{7-x}$ Fibers Prepared By The Sol-Gel Process", Extended Abstracts, *High-Temperature Superconductors II*, Ed. Capone et al Apr. 5-9, 1988; pp. 93-96.

Wu et al, "Synthesis Study of Superconducting $4Ba_2Cu_3O_{7-x}$ Powers From Metal-Alkoxides", *High-Temperature Superconductors* MRS vol 99, Nov. 30-Dec. 4, 1987 Symposium, pp. 395-397.

*Primary Examiner*—M. L. Bell
*Assistant Examiner*—C. M. Bonner
*Attorney, Agent, or Firm*—Spencer, Frank & Schneider

[57] ABSTRACT

Fine and homogeneous oxide particles for superconductors which can be sintered at a low temperature are prepared in a liquid phase by the sol-gel method using alkoxides as starting materials. By forming a buffer layer between a substrate and a superconducting film, good-quality and oriented superconducting film can be fabricated. Highly c-axis-oriented superconducting film and bulk products can be prepared from particular starting compositions in Ln-Ae-Cu-O and Bi-Ae-Cu-O systems. The oriented film can be produced by painting a paste of such starting compositions on a substrate followed by sintering, and the bulk form can be produced by pressing the pre-sintered powder of such starting compositions.

14 Claims, 29 Drawing Sheets

○ HIGHLY ORIENTED
△ PARTIALLY ORIENTED
× NON-ORIENTED

PROCESSES FOR PREPARING OXIDE POWDERS AND SUPERCONDUCTING OXIDES

BACKGROUND OF THE INVENTION

1. Field of the Invention

The present invention relates to a process for preparing oxide powders which are used as starting materials for producing high temperature superconducting ceramics and to a process for fabricating the superconducting oxide ceramics.

The present invention also relates to processes for producing c-axis oriented superconducting film and bulk materials.

2. Background of the Related Art

Recently, superconducting oxide ceramics which show superconductivity at or above the liquid nitrogen temperature have been found. For example, $YBa_2Cu_3O_{7-x}$ and $LnBa_2Cu_3O_{7-x}$ (Ln: a lanthanoid) have been reported to be superconductors having a superconducting transition temperature ($T_c$) at about 90K. These high-$T_c$ superconducting oxides are favorable for wide commercial application, because the price of the liquid nitrogen used as the cooling medium is about 1/10 of that of liquid helium. These superconductors are fabricated from oxide powders as starting materials. Since the properties of the superconductors themselves are strongly influenced by the starting materials, not only is the fabrication process for the superconductors being widely investigated, but also the method for producing the starting oxide powders.

A solid phase reaction method and a coprecipitation method are known techniques for producing oxide powders for superconductors. The fabrication process of the solid phase reaction method is as follows; a mixture of oxides, such as CuO, $Y_2O_3$ (or $Ln_2O_3$) and $BaCO_3$, in a certain ratio is sintered at a temperature of 950°-1000° C. to make $YBa_2Cu_3O_{7-x}$ or $YLn_2Cu_3O_{7-x}$ in a solid phase reaction at a high temperature, and then the sintered product is slowly cooled to room temperature and is ground into powder. The fabrication process of the coprecipitation method is as follows; oxalic acid is added to an aqueous solution of $Cu(NO_3)_2$, $Ba(NO_3)_3$ and $Y(NO_3)_3$ or $Ln(NO_3)_3$ to precipitate metallic ions as oxalates, and then the resultant precipitants are dried and calcinated at a temperature of 900°-1000° C. to decompose the oxalates into oxides, and the products are slowly cooled and ground into powder.

In the solid phase reaction method, a one hundred percent reaction of the components cannot be accomplished and, hence, unreacted oxides are often present in the product. On the other hand, while in the coprecipitation method more homogeneous products can be obtained than in the solid phase reaction method, the starting composition and the composition of the products are different, which is caused by the higher solubility of barium oxalate than the solubility of the other components.

From the point of view of crystalline phase change, in both of these techniques, a non-superconducting phase (tetragonal phase) appears upon sintering at 900°-1000° C. during the first stage. Then, the tetragonal phase is transformed into a superconducting phase (orthorhombic phase) by absorption of oxygen during the subsequent slow cooling process in an oxygen-rich atmosphere. The reason why a sintering temperature higher than 900° C. is necessary is that the large particle size of the starting powders made by these techniques results in low activity in the reaction.

Moreover, after grinding of the calcined products, the particle size of the powder is on the order of a few micrometers and the size distribution is not as sharp. Therefore, to make a dense product from the powder made by these techniques, re-sintering at a temperature higher than 1000° C. is required. Since such a high temperature sintering often generates other crystal phases (not the $YBa_2Cu_3O_{7-x}$ or $LnBa_2Cu_3O_{7-x}$ phase), however, sometimes the $T_c$ of the sample was lower than the liquid nitrogen temperature.

Meanwhile, for forming a superconducting film, various techniques have been investigated including a method using a reaction in the gas phase, such as the plasma spray coating technique, a vacuum evaporation technique, a sputtering technique, and coating methods, such as the screen printing technique and the spin coating technique. These techniques include a heating process after the formation of the film on a substrate, and have some problems. In the vacuum evaporation and the sputtering techniques, the composition of the film is often different from the starting material composition. Furthermore, in the sputtering process, crystal structure and orientation of the resultant film are strongly influenced by the substrate temperature. The screen printing technique also has the problems that a dense film cannot be obtained easily because of the large particle size of the starting powder, and that the critical current density of the film made by this technique is lower than that of a film formed by sputtering. Another technique for producing super-conducting film has been proposed; organometallic compounds, such as yttrium stearate, barium naphthenate and copper naphthenate, are dissolved into a suitable solvent and are coated on a substrate and heated to decompose into an oxide film. This technique, however, has the problem that carbon remains in the film because of the strong reducing atmosphere in the sintering process.

When silicon or silica glass are used as substrates for superconducting oxide films, the superconducting phase cannot be obtained because of the reaction between the copper in the oxide film and the substrates during the sintering process. Accordingly, substrates having low reactivity during sintering, such as yttrium-stabilized zirconia (YSZ) or the like, are used as a substrate for film forming. Such a type of substrate, however, has the following problems: (1) since the substrate is an insulator, for a superconducting device involving circuit application, another substrate which is semiconducting is required; and (2) since it is difficult to make variously shaped substrates, such as fiber or tape, from ceramics, the substrate shape is limited to that of a plate.

For practical application of the superconducting material, a high critical current density and a high critical magnetic field should be secured. It is known that if the superconducting crystal is c-axis oriented and a current is flowed along a surface perpendicular to the c-axis, critical current density is improved. Therefore, it is desirable that the superconducting crystal have a particular orientation. Although, when the $YBa_2Cu_3O_x$ powder is pressed into a pellet shape, c-axis orientation has been observed, no method has been reported to realize c-axis orientation effectively.

SUMMARY OF THE INVENTION

It is an object of the present invention to provide a process for producing a homogeneous superconducting oxide powder which has a small particle size and can be sintered at a low temperature for solving the above-mentioned problems.

It is another object of the present invention to provide a process for making a high $T_c$ superconducting oxide by sintering at a low temperature.

It is a further object of the present invention to provide a layered superconducting structure formed on a substrate which has good superconducting properties without any particular limitation regarding substrate material.

It is a still further object of the present invention to provide a process for forming a superconducting oxide film or bulk product having a high degree of c-axis orientation.

In a first aspect of the present invention, a process for preparing an oxide powder, comprises the steps of:
  separately dissolving corresponding raw material alkoxides of a plurality of elements to constitute a super-conducting oxide in a solvent;
  mixing a plurality of the resulting solutions together;
  subjecting the resulting mixed solution to hydrolysis to give a sol; and
  evaporating the solvent in the sol.

In a second aspect of the present invention, a process for preparing an oxide powder, comprises the steps of:
  separately dissolving corresponding raw material alkoxides of a plurality of elements to constitute a super-conducting oxide in a solvent;
  mixing the resulting solutions, subjecting the resulting mixed solution to hydrolysis to give a sol, and evaporating the solvent in the sol to prepare a condensed solution;
  forming the concentrated solution into a continuous body; and
  sintering the continuous body.

Here, the plurality of elements may be yttrium or at least one lanthanoid, at least one alkali earth metal and copper.

A dilute solution of an alkoxide of yttrium or a lanthanoid prepared by an exchange reaction of its chloride with a sodium alkoxide may be used as the raw material of yttrium or lanthanoid. The plurality of elements may be at least one alkali earth metal, bismuth and copper.

At least one operation among dissolution and hydrolysis may be conducted while refluxing the solution or suspension. The solution or suspension after hydrolysis may be kept at a given temperature to effect aging thereof.

A powder of the oxide may be mixed with an oxide(s) or carbonate(s) of individual element(s) which constitute a superconducting oxide, followed by forming and baking.

The continuous body may have bulk form. The continuous body may be a film.

The film may be formed on a buffer layer provided on a substrate. The buffer layer may be a layer comprising zirconia as the main component.

The oxide may have a composition for which $Ln/(Ln+Ae+Cu) < 16.6$ mole %, $Cu/(Ln+Ae+Cu) > 50$ mole %, and $Ae =$ the balance, wherein Ln is yttrium or at least one lanthanoid, and Ae is at least one alkali earth metal. Further, a powder of the oxide may be pressed to orient the c-axes of its crystals in parallel with the pressing direction.

The oxide may have a composition for which $Bi/(Bi+Ae+Cu) = 5$ to 40 mole %, $Ae/(Bi+Ae+Cu) = 15$ to 70 mole %, and $Cu/(Bi+Ae+Cu) = 24$ to 64 mole %, wherein Ae is at least one alkali earth metal. Further, a powder of the oxide may be pressed to orient the c-axes of its crystals in parallel with the pressing direction. The powder may have a composition for which $Bi/(Bi+Ae+Cu) = 5$ to 40 mole %, $Ae/(Bi+Ae+Cu) = 15$ to 40 mole %, and $Cu/(Bi+Ae+Cu) = 24$ to 64 mole %.

In a third aspect of the present invention, a layered superconducting oxide structure is characterized by comprising:
  a substrate;
  a buffer layer formed on the substrate and having a low reactivity with the material of the substrate; and
  a superconducting oxide film formed on the buffer layer.

Here, the buffer layer may be an oxide film consisting of zirconia or comprising zirconia as the main component.

In a fourth aspect of the present invention, a process for preparing a superconducting oxide, comprises the steps of:
  sintering an oxide powder to develop a superconducting phase;
  grinding the resulting sinter into a fine powder; and
  pressing the fine powder to develop c-axis orientation in a direction parallel with the pressing direction.

Here, the oxide powder may have a composition for which $Ln/(Ln+Ae+Cu) < 16.6$ mole %, $Cu/(Ln+Ae+Cu) > 50$ mole %, and $Ae =$ the balance, wherein Ln is yttrium or at least one lanthanoid, and Ae is at least one alkali earth metal.

The oxide powder may have a composition for which $Bi/(Bi+Ae+Cu) = 5$ to 40 mole %, $Ae/(Bi+Ae+Cu) = 15$ to 70 mole %, and $Cu/(Bi+Ae+Cu) = 24$ to 64 mole %, wherein Ae is at least one alkali earth metal.

The oxide powder may have a composition for which $Bi/(Bi+Ae+Cu) = 5$ to 40 mole %, $Ae/(Bi+Ae+Cu) = 15$ to 40 mole %, and $Cu/(Bi+Ae+Cu) = 24$ to 64 mole %.

DESCRIPTION OF THE PREFERRED EMBODIMENTS

Figure 1:
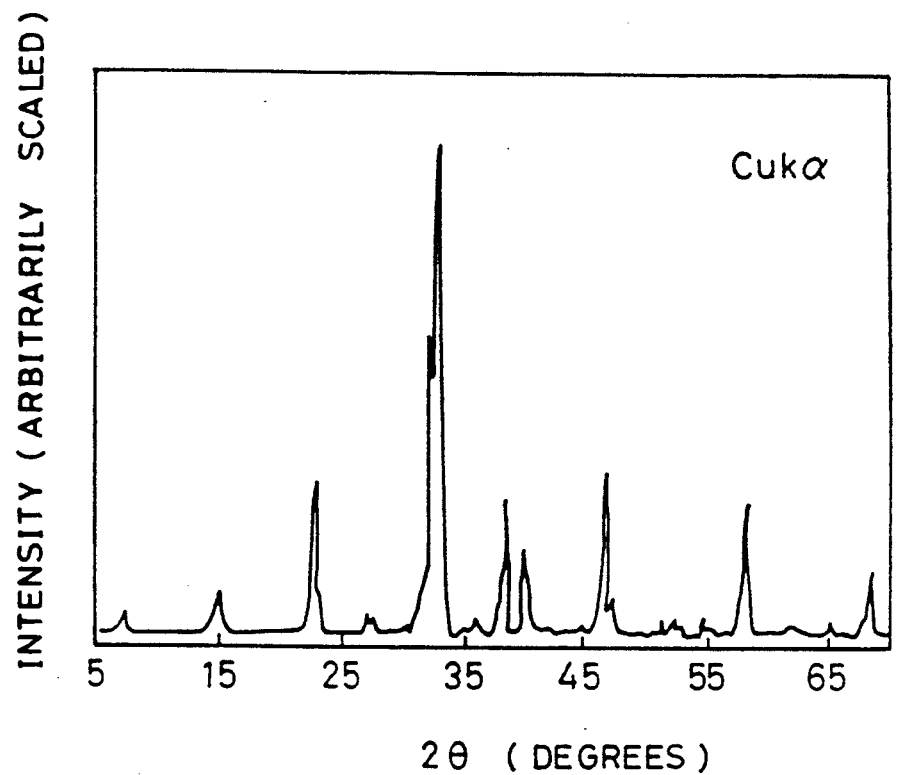
FIG. 1 shows an X-ray diffraction pattern of a powder prepared by the sol-gel method in accordance with the present invention.

The sol-gel method using alkoxides as starting materials in accordance with the present invention will be presented below.

In the present invention, for preparing superconducting powder, alkoxides are dissolved into solvents and mixed. Then, they are hydrolyzed and dried.

According to the process of the present invention, since raw materials are dissolved into the solvent and hydrolyzed into fine, complex oxide particles in a liquid phase, the resultant particles are very small in size and homogeneous. Thus, these powders made by the process of the invention have higher activity for sintering than those made by conventional processes and are obtained by reaction at lower temperature.

Alkoxides $M(OR)_n$ (where M is metal, OR is an alkoxyl group and n is the valence state of metal M) are hydrolyzed by water into metallic oxides (or their hydrates) and an alcohol, as shown in the following reaction equations

If two or three alkoxides are hydrolyzed simultaneously, fine, double or triple complex oxide particles can be formed at a temperature below the boiling point of the solvent.

Generally, the powders prepared by hydrolysis of alkoxides have a small size ranging from 0.001 to 0.01 μm. This means that the powder has a large surface energy and shows a good packing ability. Therefore, a dense product can be obtained by sintering at relatively low temperature.

The processes of the present invention will be presented below in detail including: (1) preparation of a solution, (2) hydrolysis, (3) aging and (4) drying processes.

(1) Preparation of a Solution

Since, in general, alkoxides of copper, barium, yttrium and lanthanoids are all solids at room temperature, solubility of the alkoxides in organic solvents is one of the key points in selection. If the solubility of the alkoxide is very low, an enormous amount of solvent is necessary to hydrolyze and polymerize uniformly, which is far from economical. The solubility of alkoxide powders in 1 liter of various solvents is determined by experiment (Table 1).

TABLE 1

Solubility of Alkoxide Powders

| Alkoxide | Solvent | Solubility (g) in 1 l of Solvent (20° C.) |
|---|---|---|
| $Cu(OCH_3)_2$ | $CH_3OH$ | 10 |
| $Cu(OC_2H_5)_2$ | $C_2H_5OH$ | 12 |
| $Cu(i-OC_3H_7)_2$ | $i-C_3H_7OH$ | 15 |
| $Ba(OCH_3)_2$ | $CH_3OH$ | 0.04 |
| $Ba(OC_2H_5)_2$ | $C_2H_5OH$ | 0.07 |
| $Ba(i-OC_3H_7)_2$ | $i-C_3H_7OH$ | 0.09 |
| $Y(OCH_3)_3$ | $CH_3OH$ | 0.01 |
| $Y(OC_2H_5)_3$ | $C_2H_5OH$ | 0.01 |
| $Y(i-OC_3H_7)_3$ | $i-C_3H_7OH$ | 0.02 |

As shown in Table 1, the solubility of barium and yttrium alkoxides in 1 liter of solvent are on the order of several ten mg, which is one hundredth of that of copper alkoxides. The solubility of lanthanoids are on the same order as those of yttrium alkoxides. These results indicate that it is impractical to use dried powder alkoxides of barium, yttrium or lanthanoids as starting materials because of their low solubilities.

Nevertheless, it was found in an experiment that alkoxides can be dissolved in a solvent just after synthesis. For example, barium alkoxide, which can be obtained by direct reaction of metallic barium with an alcohol using a reflux technique as shown in the following reaction equation, can be dissolved (several tens of grams) in 1 liter of an alcohol solvent before cooling:

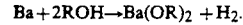

Yttrium or lanthanoid alkoxides which can be synthesized by an exchange reaction of yttrium or lanthanoid chlorides with a sodium alkoxide using the reflux technique in an alcohol solvent (given in the following reaction equation), can also be dissolved (several grams) in 1 liter of the alcohol solvent before cooling:

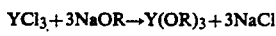

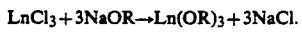

Although the basis for these phenomena is not clear, if, after synthesizing, barium, yttrium or lanthanoid alkoxides are used immediately, completely dissolved alkoxides are available for the next reaction. It should be noted that in order to avoid cooling, the alkoxide solutions must be treated immediately after synthesizing. An alcoholic solution containing two equivalents of barium alkoxide is mixed with a solution containing one equivalent of yttrium alkoxide with no cooling. And, then, three equivalents of copper alkoxide solution are added with vigorous stirring. Thus, a starting solution is obtained. For instance, 0.01 mole of $YBa_2Cu_3O_x$ can be dissolved in 1 liter of solvent when isopropanol and isopropoxides are used as solvent and alkoxides, respectively.

It is desirable that the starting solution including alkoxides should be refluxed more than 10 minutes. The refluxing provides a chance for dispersed alkoxides to meet one another in solution and enables them to form a polynuclear complex or multialkoxide which have similar coordination states as that of the oxides. An oxide powder having a multicomponent single phase can be obtained through hydrolysis of these polynuclear complexes or multialkoxides.

It is also preferable that refluxing during alkoxide synthesizing and mixing is carried out under a dry atmosphere so as not to hydrolyze same with the moisture in air.

(2) Hydrolysis

During hydrolysis, a large amount of water is intolerable, because water-soluble hydroxides are formed from which copper or barium oxides are generated during subsequent drying and heating processes.

Deionized water with high purity should be used, because dissociation of copper or barium from the complex compounds is caused by impurities, such as the chlorine ion, in the water and hence a change in the compositions results. Furthermore, water diluted with the solvent is recommended for obtaining a uniform hydrolysis reaction.

(3) Aging

The dried powder, which is obtained from the solution just after hydrolysis, has a small particle size and a high surface activity. Thus, the powder has several problems including: (1) low crystallinity, (2) primary particles easily aggregate, (3) remarkable adsorption of water on the particle surface in air, and (4) abnormal grain growth and bubble formation during the sintering process. To avoid these problems, powders having diameters ranging from 0.01 to 0.1 μm can be prepared by refluxing or holding the solution at a temperature close to the boiling point of the solvent after hydrolysis. A partially dried or condensed solution after aging is close to a gel state, and in it, copper, barium and yttrium exist mostly in the oxide form with a size of less than 1 μm. The process for preparing these starting materials is called the sol-gel method.

(4) Drying

Available drying methods include keeping the suspension involved as fine particles at a temperature lower than the boiling point of the solvent, or under reduced pressure for evaporating the solvent, and spraying the suspension in the form of small droplets and drying same rapidly in hot air.

The powders, produced as described above, have a size of 1 μm or less and a single phase for superconducting oxides. Thus, they can be sintered at a temperature lower than that of the conventional processes.

The present invention will be described in detail in the following examples.

EXAMPLE 1

Metallic barium of 0.02 mole was added to 1 liter of isopropanol and refluxed at 83° C. for 30 minutes. A colorless, transparent barium isopropoxide dissolved in the isopropanol was obtained. Yttrium isopropoxide dissolved in 1 liter of isopropanol (concentration: 0.01 mole/liter) at 70° C., was prepared by an exchange reaction of yttrium chloride and sodium isopropoxide and used just after preparation, was added to the barium isopropoxide solution and refluxed again for 30 minutes. Thereafter, copper isopropoxide powder of 0.03 mole was added to the resultant solution and refluxed again for 1 hour. Into this homogeneous solution, 0.6 mole of pure water was added during refluxing. After refluxing for 2 hours, the solvent was evaporated at 70° C. under reduced pressure, and a powder was obtained.

The resultant powder sample was heated at 200° C. for 1 hour and the specific surface area was measured by the BET method. The specific surface area value corresponded to an average particle size of 0.005 μm.

Figure 2:
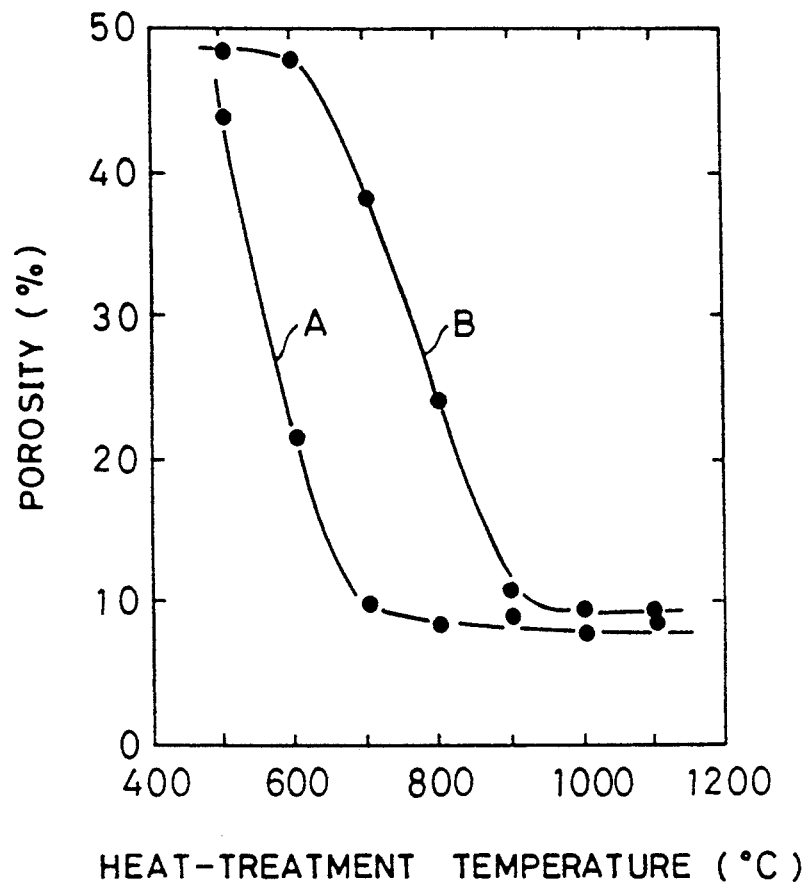
FIG. 2 shows change of porosity with treatment temperature for samples prepared according to the present invention.

The powder was pressed into pellets and heated at various temperatures for 1 hour in a furnace under an oxygen atmosphere, followed by slow cooling to room temperature. In FIG. 1, an X-ray diffraction pattern of the sample heated at 750° C. is shown. The sample shows a single phase of $YBa_2Cu_3O_{7-x}$. Porosity change was measured against treatment temperature (Curve A in FIG. 2). At 750° C., the porosity was about 10% and sintering of the sample was completed. The electrical resistance of the sample heated at 750° C. was measured by the DC four-probe technique and the temperature of zero resistance was about 90 K.

EXAMPLE 2

Powder yttrium, barium and copper isopropoxides of 0.01, 0.02 and 0.03 mole, respectively, were added into 1 liter of isopropanol and refluxed with stirring at 83° C. for 8 hours. The alkoxides were not perfectly dissolved into the solvent and black precipitates remained. Water of 0.6 mole was added into the suspension while refluxing, and refluxing was continued for 2 hours. Thereafter, the solvent was evaporated at 70° C. under reduced pressure and a powder sample was obtained.

The crystal phase of the powder was identified by its X-ray diffraction pattern as a mixture of CuO, $Y_2O_3$ and $BaCO_3$.

The powder was heated at 400° C. for 5 hours to evolve solvent and adsorbed water, and then the specific surface area was measured by the BET method. The average particle size was calculated from the surface area value to be 0.012 μm assuming spherical particles.

The powder was pressed into pellets and heated in a furnace at various temperatures in an oxygen atmosphere, followed by slow cooling to room temperature. Crystal phase of the samples was determined by the X-ray diffraction method. As a result, it was found that 750° C. heating gave mixed phase of CuO or $BaCO_3$ and $YBa_2Cu_3O_{7-x}$. On the other hand, 900° C. heating gave a single phase of $YBa_2Cu_3O_{7-x}$. Porosity change after heating was measured against treatment temperatures (Curve B in FIG. 2) by a mercury injection method. The result indicates that shrinkage began at 600° and finished at 900° C. The porosity after 900° C. heating was 11%. Resistance was measured by a conventional four-probe method. The zero resistance temperature after 900° C. heating was about 88 K.

EXAMPLE 3

Powder was produced by a similar process as that described in example 1 except for the refluxing time after hydrolysis. After 24 hours refluxing, powder was heated at 200° C. for 1 hour and the specific surface area was measured by the BET method. The average particle size corresponds to the surface area value and was 0.09 μm. Thus, by controlling the reflux time, particles within 0.05 μm to 0.09 μm can be obtained by this technique.

EXAMPLE 4

Instead of yttrium isopropoxide, ytterbium or holmium isopropoxides were used and a similar experiment to example 1 was carried out. As a result, a $LnBa_2Cu_3O_{7-x}$ (Ln is Ho or Yb) single phase was obtained by heating at 750° C. Both of the samples showed about a 10% porositity and a $T_c$ of around 90 K.

As shown in this example, a system containing a lanthanoid also provides powders with a small particle size and a single phase of a superconducting oxide. Dense superconducting sintered oxides which show the superconducting state above the boiling temperature of nitrogen can be obtained by treatment at a relatively low temperature, 750° C.

A very fine powder can be prepared by the sol-gel method of the invention. The powder, however, has some problems, such as adsorption of water in air and bubbling during the sintering process. These problems of the sol-gel powder can be improved by mixing them with superconducting oxide crystals of micron or submicron particle size which were prepared by treatment of commercially available reagents or commercially available oxide powders at high temperatures.

As commercially available powders, a mixture of $Y_2O_3$, CuO, $BaCO_3$, etc. mixed in a predetermined ratio, can be used for mixing with the sol-gel powders. Also, powder in the superconducting phase which was prepared from commercially available reagents by sintering at 900°–950° C. in an oxygen atmosphere, followed by slow cooling to room temperature, can be used for mixing with the sol-gel powders.

EXAMPLE 5

First of all, the properties of the powder made by the sol-gel technique and a mixture of powder of commercially available reagents are compared to each other.

A copper ethoxide ($Cu(OC_2H_5)_2$) powder, barium butoxide ($Ba(OC_4H_9)_2$) in butanol and yttrium butoxide ($Y(OC_4H_9)_3$) in butanol were weighed to make a mixture having a Y:Ba:Cu= 1:2:3: mole ratio and were mixed with 1-butanol as a solvent. The resultant solution was refluxed at about 120° C. for 10 hours and distilled water of 5 to 10 times the total molar amount of Y, Ba and Cu was added. Then, the solution was refluxed for about 10 hours to complete hydrolysis and fine particles were generated in the solution. The solution including the fine particles was kept at about 120° C. to evaporate the solvent. Dry sol-gel powder was obtained and stored in a dry box. On the other hand, commercially available reagents of $Y_2O_3$, $BaCO_3$ and CuO were weighed to make a mixture having a 1:2:3 mole ratio and mixed.

Figure 3:
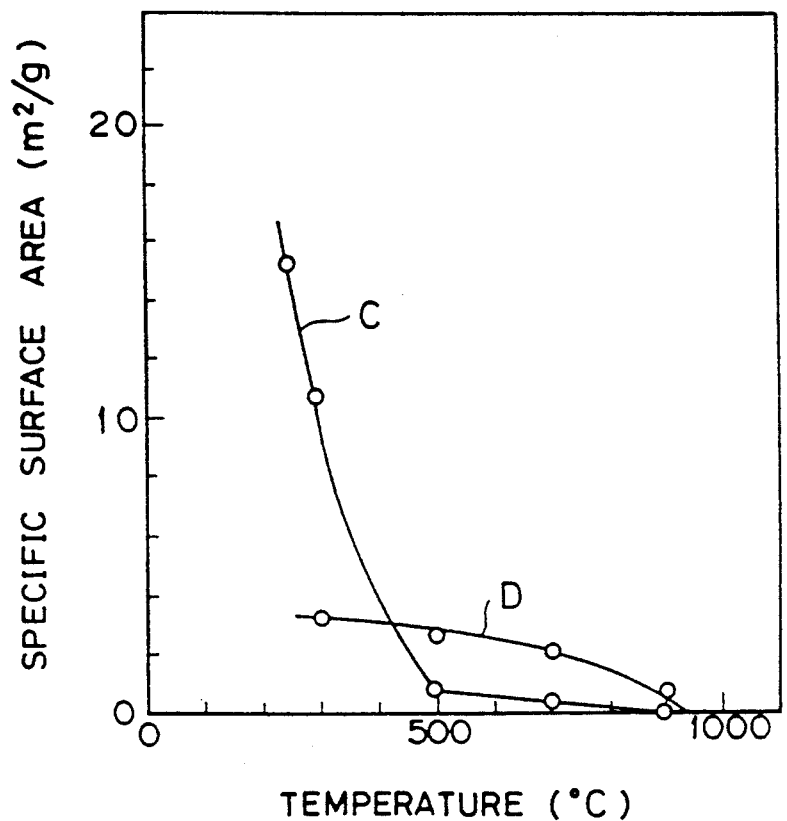
FIG. 3 shows the relationship between specific surface area and treatment temperature for a powder mixture made by the sol-gel method in accordance with the present invention and a commercially available powder mixture.

For comparison, the sol-gel powder and the mixture of the commerically available reagents were heated at a temperature ranging from 250° to 900° C. and specific surface areas of the samples were measured by the BET method (FIG. 3).

In the sol-gel powder (curve C in FIG. 3), a decrease in specific surface area was already observed at around 300° C., which indicates the start of sintering at this temperature. By contrast, the mixture of commerically available reagents (curve D in FIG. 3) showed a gradual decrease in surface area at above 900° C. (indicating the progress of the sintering). The heat treated samples were examined by X-ray diffraction. In the sol-gel powder, some peaks which can be assigned to a superconducting phase were observed in the sample heated at 750° C., while in the commerically available powder mixture, the peaks of a superconducting phase were observed in the sample heated at or higher than 900° C.

Figure 4A:
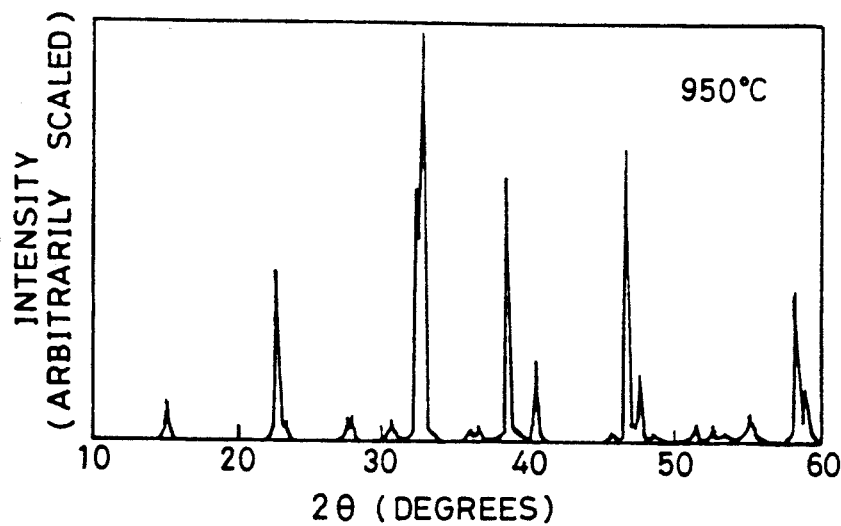
FIGS. 4A, 4B and 4C show X-ray diffraction patterns for samples sintered at 750, 800° and 950° C.
Figure 4B:
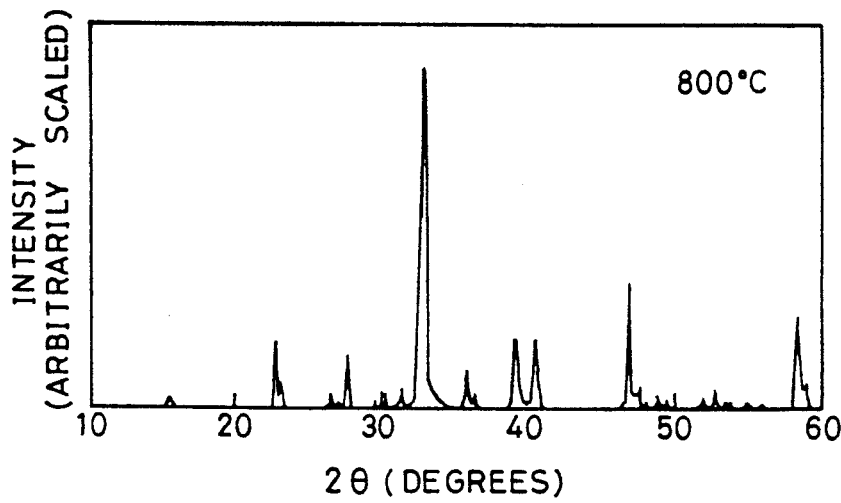
Figure 4C:
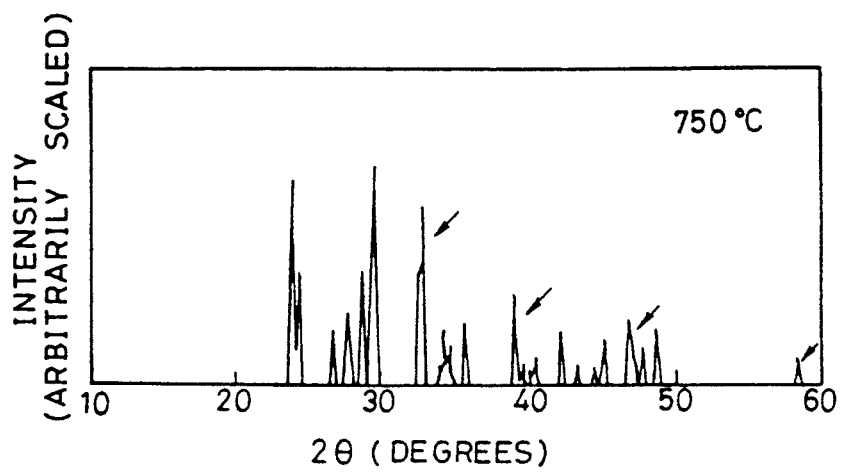

The commerically available powder mixture was sintered at 950° C. in an oxygen atmosphere and slowly cooled (hereinafter call "commercially available sintered powder"). The sol-gel powder was mixed with the commercially available sintered powder in a weight ratio of 1:1. The resultant mixture of powder was sintered at various temperatures of 400°, 500°, 750°, 800° and 950° C., and the X-ray diffraction patterns were measured. The resulting X-ray diffraction patterns of the samples heated at 750°, 800° and 950° C. are shown in FIGS. 4A, 4B and 4C.

Peaks which can be assigned to the superconducting phase (shown by an arrow in the diffraction pattern of the powder sintered at 750° C.; other peaks are assigned to $BaCO_3$) appeared in the samples heated at or above 750° C. In the 800° C. sample, a single phase of $YBa_2Cu_3O_{7-x}$ was observed and the diffraction pattern was almost the same in the 950° C. sample. Thus, it can be said that the superconducting phase appeared at 800° C.

The above results indicate that the technique of mixing the sol-gel powder with the commercially available powder can improve the above-mentioned problems, such as adsorption of water and so on, and also showed that the superconducting phase can appear at a temperature lower than that of the conventional technique.

Powders prepared by mixing the sol-gel powder with the commercially available sintered powders in the ratios of 1:1, 1:05 and 0.5:1 were pressed into pellets and sintered. The electrical resistance versus temperature curves of these samples were measured by a conventional four-probe technique. They showed zero resistance temperatures at about 80 to 90 K.

A method for preventing reaction of a superconducting oxide film and a substrate during the sintering process will be described below. A buffer layer is formed on a substrate, and a superconducting oxide film is formed on it.

It is preferable to use zirconia for the buffer layer, because it has a low reactivity at high temperature. Zirconia, which has a transition point at about 1100° C., shows a large volume change when it is transformed from a tetragonal (high-temperature form) to a rhombic phase (low-temperature form). Thus, heating higher than the phase transition point often causes breakage of the film during the course of temperature rise and fall. Therefore, it is more preferable to use zirconia containing yttrium, calcium etc. of 20% or less, because addition of these elements stabilizes a cubic phase in the low temperature region and suppresses the tetragonal-rhombic phase transition. In order to prevent reaction of the superconducting film and the substrate, more than a 0.1 μm thickness of zirconia buffer is necessary. A method for forming a zirconia buffer layer will be described in detail below.

Procedures for forming a zirconia film include: (1) washing a substrate, (2) preparing a sol, (3) coating, (4) drying, and (5) sintering.

(1) Washing a Substrate

Substrates such as silicon, $SiO_2$ glasses, alumina etc. are washed with an acid, pure water, an organic solvent, and dried. Acids, for example, nitric acid and hydrofluoric acid can be used for removing foreign mattter from a substrate surface. Sufficient drying of a substrate is required, because water or something like that on the surface prevents the formation of homogeneous buffer film.

(2) Preparing a Sol

Desirable conditions for preparing a sol depend on the main starting materials of the film. Cases where zirconia alkoxides and organometallic acids are used respectively are described. Zirconium alkoxides: the zirconium alkoxide is diluted with a solvent containing a hydrolysis-suppresser. Often compounds of elements for stabilizing a cubic phase of zirconia, such as yttrium or calcium, are added in a solvent. Zirconium propoxide and butoxide are recommended since they are mildly hydrolyzed (when compared with the methoxide or ethoxide). The hydrolysis-suppressor is used to suppress the rate of hydrolysis of high-activity alkoxides and to make a homogeneous sol. The suppressors include a carboxylic acid, such as acetic acid, and polyhydric alcohols, such as ethyleneglycol, and acetylacetone, and so on. More than 0.01 mole of suppressor is needed for 1 mole of alkoxide. As the solvent, organic materials which have boiling points of 200° C. or below are preferable, because they can be evaporated easily. The ratio of the solvent is more than 1 mole and less than 1000 mole for 1 mole of alkoxide. Alkoxides are also preferable for the starting reagents of yttrium and calcium. Addition of water containing an acid catalyst, such as diluted hydrochloric acid, into the sol is useful to keep the properties of the sol for a long period of time because the addition moderates a polycondensation reaction. Organometallic acid: for example, when zirconium acetate is used, a hydrolysis-suppresser or even water is not necessary. The other conditions are the same as in the case of zirconium alkoxide.

(3) Coating

Sol is uniformly coated on a clean substrate. Adequate coating methods include the dipping method, spin-coating method, spray coating method, and die coating method. The thickness of the film can be controlled by choosing the concentration of raw materials, speed of pulling up in the dipping technique, rotation speed in the spin-coating technique, spray rate in the spray coating technique, and pulling speed in the die coating technique. Since formation of a thick film by one-step coating results in cracking of the film during the drying process, the thickness of the film formed by one-step coating must be restricted within 0.5 μm.

(4) Drying

The sol films coated on substrates are put in air. Then, hydrolysis and evaporation of the solvent proceed and dry films can be obtained. Drying should be done in an atmosphere where the humidity and vapor pressure is controlled to be constant.

(5) Sintering

A $ZrO_2$ film on a substrate can be obtained by sintering at a temperature of 500° C. or higher. The sintering atmosphere desirably contains oxygen.

The film fabricated in the above-mentioned manner is a dense and homogeneous film with a fine rhombic or cubic zirconia phase of 0.01 to 0.5 μm in thickness. A thick zirconia film can be produced by repeating the sol coating and drying, followed by sintering or by repeating all procedures from sol coating to sintering.

Various methods can be applied to form a superconducting oxide film on the buffer layer. The liquid-phase technique gave an oriented superconducting film on a zirconia-coated substrate. Particularly, a homogeneous solution with high concentration can be prepared by dissolving alkoxide starting materials in a polyhydric alcohol solvent or a mixed solvent of a polyhydric alcohol and acetic acid. The coated film made from this solution by the dipping, spin coating, or spray coating techniques, followed by drying and sintering processes, is characterized by an excellent, smooth surface.

EXAMPLE 6

A silicon wafer with a polished surface was washed with hydrofluoric acid and used as a substrate. A zirconium alkoxide, $Zr(n-OC_4H_9)_4$, was diluted with isopropanol and mixed with a small amount of acetic acid (starting sol). The substrate was dipped into the starting sol and pulled up at a certain rate. The sol coating on the substate was hydrolyzed and dried in air. The sol coated substrate was sintered in an electrical furnace at 500° C. in an oxygen atmosphere. The procedure from dipping to sintering was repeated several times and a zirconia-coated Si substrate was prepared. Meanwhile, 0.03 mole of $Cu(n-OC_4H_9)_2$, 0.02 mole of $Ba(n-OC_4H_9)_2$, and 0.01 mole of $Y(n-OC_4H_9)_3$ were dissolved in n-butanol, hydrolyzed, and the solvent evaporated. The obtained sol-gel Y-Ba-Cu-O powder was mixed with ethyleneglycol to make a paste, and printed on a zirconia-coated Si substrate by the screen-printing technique. After drying, the film was sintered at 900° C.

The zirconia film was examined by X-ray diffraction and by a scanning electron microscope (SEM). The thickness of the film was measured by the contact method. The sintered Y-Ba-Cu-O coated film was examined by X-ray diffraction, and the resistance of the film was measured by the DC four-probe technique.

Figure 5:
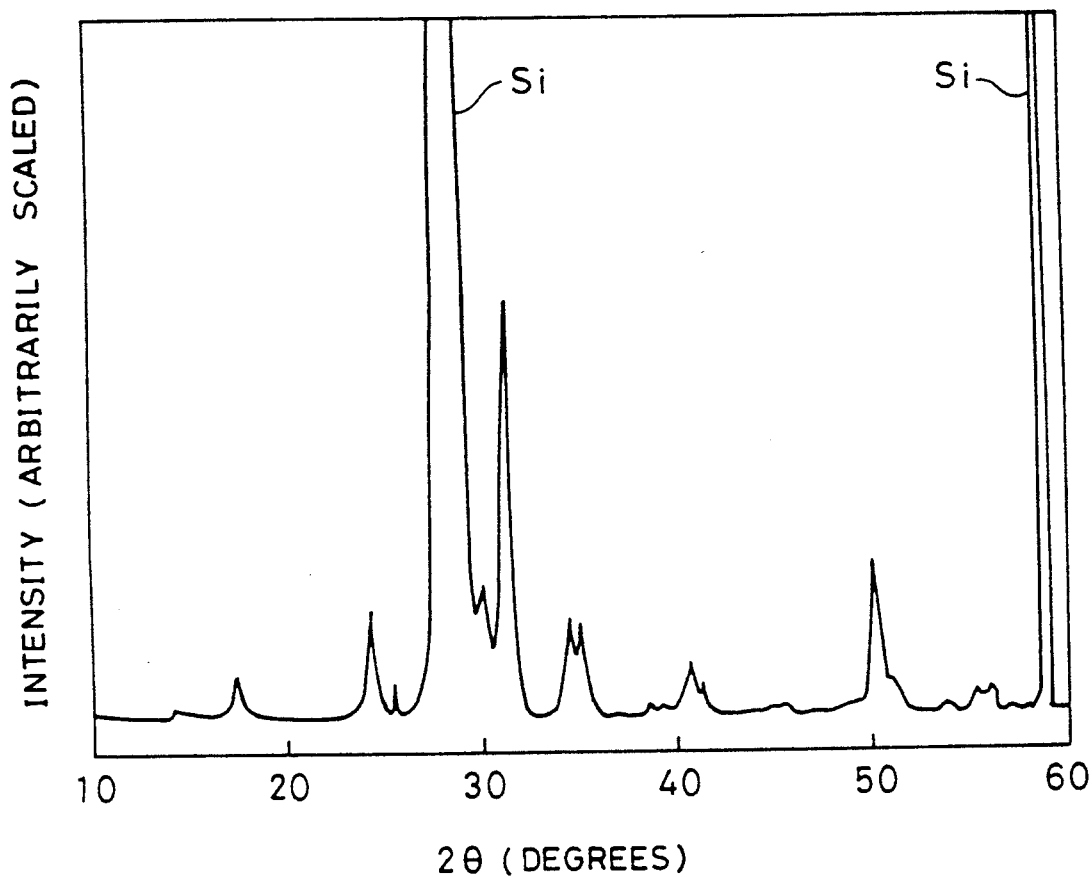
FIG. 5 shows an X-ray diffraction pattern of a zirconia film formed on an Si substrate according to the present invention.

The X-ray diffraction pattern of the zirconia film on Si substrate is shown in FIG. 5. Since the intensities of the diffraction peaks are low and their half-width values are large, the zirconia coating seems to have the form of microcrystals. High homogeneity was achieved in the zirconia film, and the surface of the zirconia film was smooth as observed by SEM.

In this experiment, one dipping gave a zirconia film of 0.05 μm in thickness. A 2.5 μm thick film was obtained by repeating the process 50 times.

Figure 6:
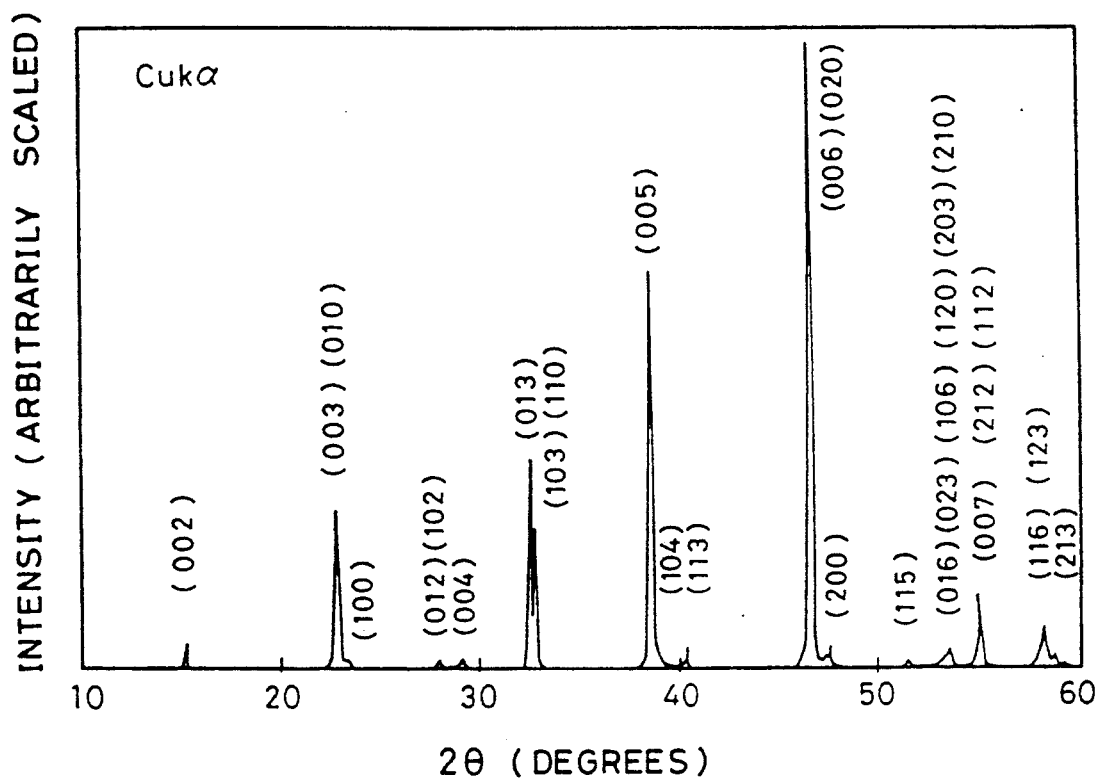
FIG. 6 shows an X-ray diffraction pattern of a sintered Y-Ba-Cu-O oxide film formed on a substrate.

The X-ray diffraction pattern of the Y-ba-Cu-O sintered film on a zirconia film of 2.1 μm in thickness is shown in FIG. 6. The film was a single phase of $YBa_2Cu_3O_{7-x}$. Since the (002), (003), (005) and (006) peaks are strong, it can be said that the film is c-axis-oriented perpendicular to the substrate surface.

Figure 7:
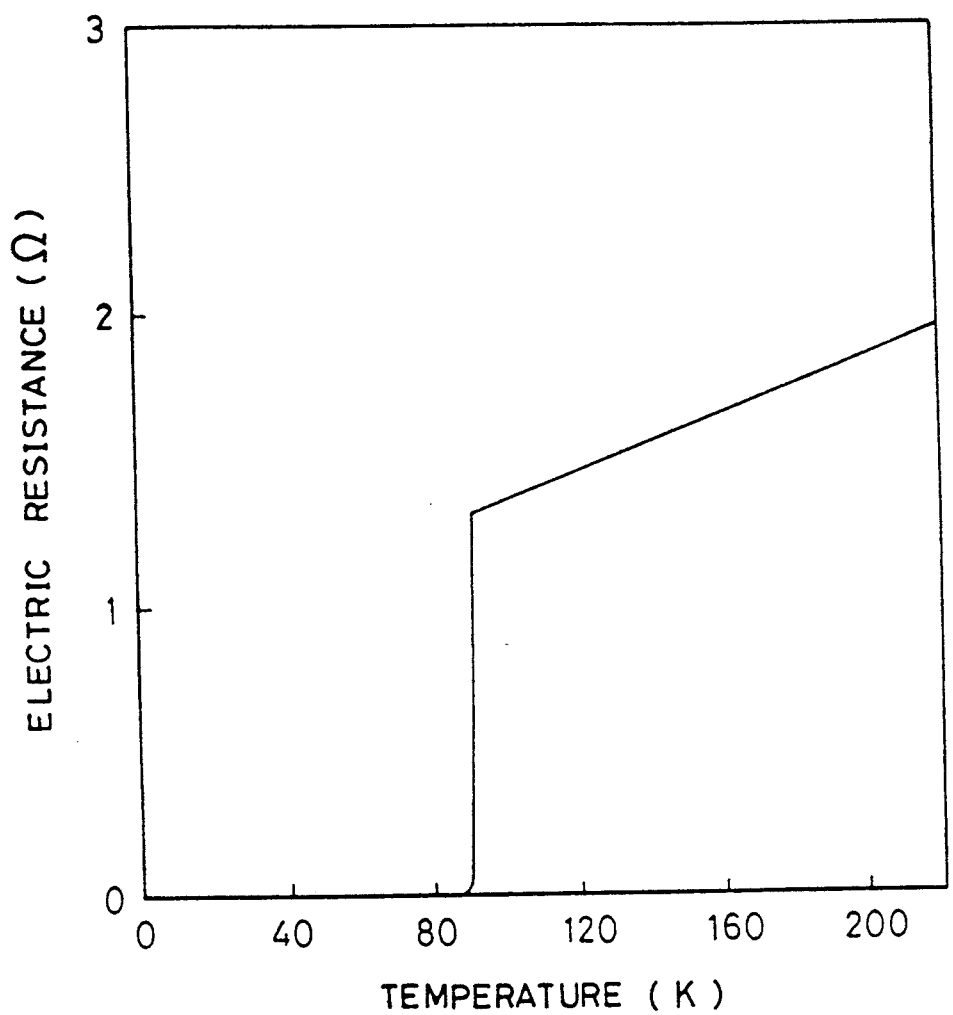
FIG. 7 shows an electrical resistance versus temperature curve for a film made in accordance with the present invention.

In FIG. 7, the electrical resistance versus temperature curve for the superconducting film is shown. The onset temperature and the zero resistance temperature were 91 K and 86 K, respectively. The transition width was 5 K. These good results are attributed to complete connection in the a-b planes, which function as the superconducting path in the film due to the c-axis orientation and the high density of the film.

EXAMPLE 7

A pure silica glass plate after washing with hydrofluoric acid was used for a substrate. $Zr(n\text{-}OC_4H_9)_4$ of 0.9 mole and $Y(n\text{-}OC_4H_9)_3$ of 0.1 mole were mixed in isopropanol as solvent and a small amount of acetic acid was added in to make a starting sol. The sol film was fabricated by the spin coating technique, hydrolyzed, and dried in air. The film was sintered in the same manner as in example 5 and the procedure from coating to sintering was repeated 50 times. $Cu(OC_2H_5)_2$ of 0.03 mole, $Ba(n\text{-}OC_4H_9)_2$ of 0.02 mole, and $Y(n\text{-}OC_4H_9)_3$ of 0.01 mole were diluted with ethyleneglycol containing acetic acid and a transparent solution was prepared. The film was made by the spin coating technique, was dried, and was sintered at 900° C. The Y-Ba-Cu-O superconducting film was obtained on the Y-stabilized zirconia buffer layer. The procedure from spin coating to sintering was repeated 50 times.

The yttrium-added zirconia film was confirmed to be a dense and homogeneous film by SEM observation, and it is composed of cubic zirconia as determined from its X-ray diffraction pattern. The cubic zirconia was stabilized by addition of yttrium down to room temperature. The film had a thickness of 1.6 μm.

The Y-Ba-Cu-O film had a 1.0 μm thickness and a smooth surface. The film was c-axis-oriented $YBa_2Cu_3O_{7-x}$ as determined from its X-ray diffraction pattern. The film showed an onset temperature of 90 K and a zero resistance temperature of 85 K.

EXAMPLE 8

A silicon wafer with a polished surface was used for a substrate. A solution of $Zr(n\text{-}OC_4H_9)_4$ was prepared in the same manner as in example 6 and was sprayed on the substrate heated at 400° C., and the solvent dried rapidly. The procedure from spraying to drying was repeated 20 times. The zirconia film was obtained by sintering the film at 900° C.

A solution of the Y-Ba-Cu system was prepared in the same manner as in the example 7 and was then sprayed on the zirconia-coated substrate, heated at 400° C., and dried. Then, a Y-Ba-Cu-O superconducting film was prepared by sintering at 900° C.

The zirconia film and the sintered Y-Ba-Cu-O film were examined by X-ray diffraction and by a scanning electron microscope (SEM), and the thickness of the films were measured by the contact method. The resistance of the Y-Ba-Cu-O film was measured by the DC four-probe technique.

The zirconia film made by the above-mentioned process was a rhombic phase and had a thickness of 1.5 μm. The sintered Y-Ba-Cu-O film was composed of an oriented $(YBa_2\text{-}Cu_3)_{7-x}$ crystal and had a thickness of 0.9±0.2 μm. The film showed an onset temperature of 90 K and a zero resistance temperature of 84 K.

EXAMPLE 9

A silica glass optical fiber was drawn from a preform in a carbon resistance furnace and immediately coated with the starting sol of zirconia (prepared in the same manner as in example 6) using the die coating technique. The coated fiber was sintered at 500° C. in a furnace installed just under the drawing furnace. Subsequently, the resultant zirconia-coated fiber was coated with a Y-Ba-Cu alkoxide mixed solution by the die coating technique, followed by sintering at 900° C. to make a oxide-coated optical fiber.

The oxide coating layer was removed and identified as the $YBa_2Cu_3O_{7-x}$ phase by the powder X-ray diffraction method.

As shown in this example, a superconducting oxide-coated optical fiber can be produced by the present invention, which suggests the possibility of a power supply to an optical communication system using a superconducting line. Although, in the above-mentioned examples, a sol solution, which was made from zirconium alkoxide by hydrolysis, was used for forming the buffer layer, the buffer layer can also be produced by a pyrolysis technique using an organic acid salt, or by a chemical or physical vapor deposition method, and so on. Moreover, although, in the examples, a silicon wafer, a silica glass plate and an optical fiber were used for the substrates, the present invention can be applied to substrates of various shapes and materials, for example, a cylinder or a tape-shaped substrate, and alumina or InP or other materials.

A method for fabricating a c-axis-oriented superconducting film will be described below.

In making an Ln-Ae-Cu-O (Ln: yttrium or a lanthanoid, Ae: at least one alkali earth metal) or a Bi-Ae-Cu-O super-conducting oxide, the use of starting materials within a particular composition region can enhance the degree of c-axis orientation.

EXAMPLE 10

A copper alkoxide, $Cu(OC_2H_5)_2$, a barium alkoxide, $Ba(OC_4H_9)_2$, and a yttrium alkoxide, $Y(OC_4H_9)_3$ were mixed together in a ratio so as to provide an oxide mixture composed of 66 mole % Cu, 27 mole % Ba, and 7 mole % Y, and were added into n-butanol as a solvent. The resultant mixed solution was refluxed for 20 hours and pure water of 5 to 10 times the total of Cu, Ba and Y was titrated into the solution with ultrasonic vibration. The solution was refluxed again for 10 hours to complete the hydrolysis reaction. Then, the homogeneous solution was partially dried to increase the viscosity and make an appropriate paste for painting onto a substrate. A part of the solution was dried completely and subjected to a composition analysis.

The paste was painted on a yttrium-stabilized zirconia (YSZ) substrate and heated at 950° C. for 30 minutes. Then, the sample was slowly cooled to 600° C. at a rate of 1° C./min, kept at 600° C. for 10 hours, and slowly cooled again to room temperature under flowing oxygen gas.

Figure 8:
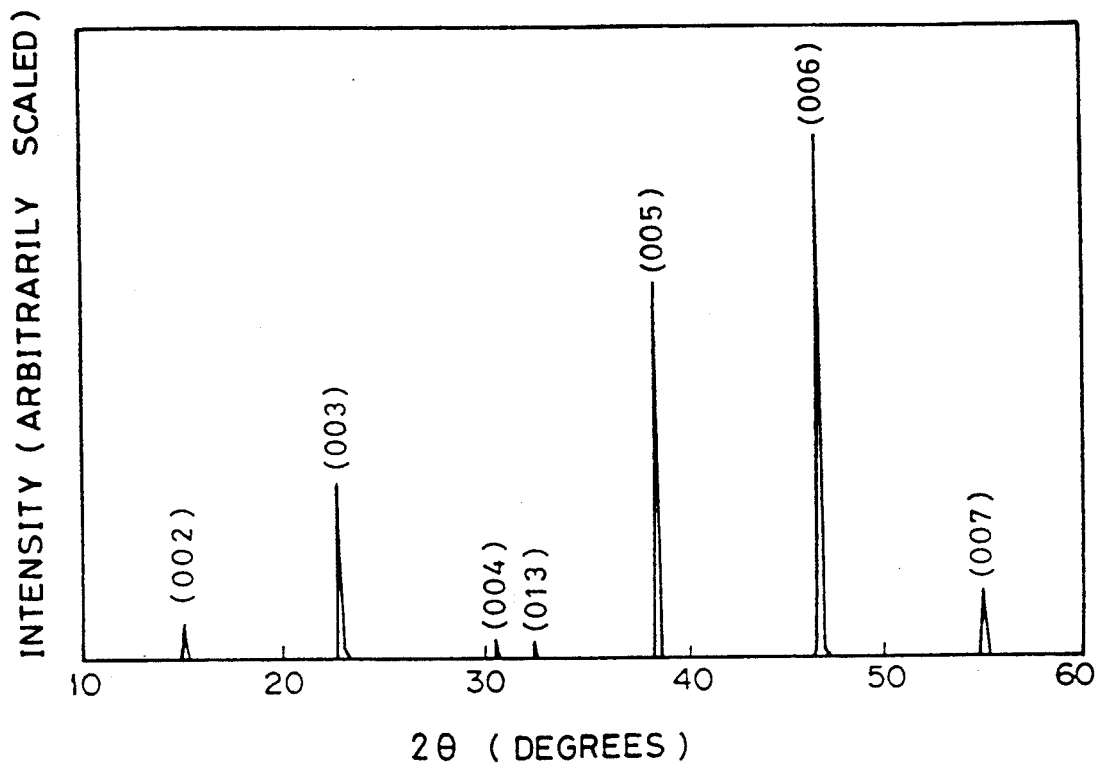
FIG. 8 shows an X-ray diffraction pattern for a c-axis-oriented Y-Ba-Cu-O film formed on a YSZ substrate.

The X-ray diffraction pattern of the resultant film on YSZ is shown in FIG. 8. Since the (002), (003), (004), (005), (006) and (007) peaks are very strong, it can be said that the film was c-axis-oriented perpendicular to the substrate.

Figure 9:
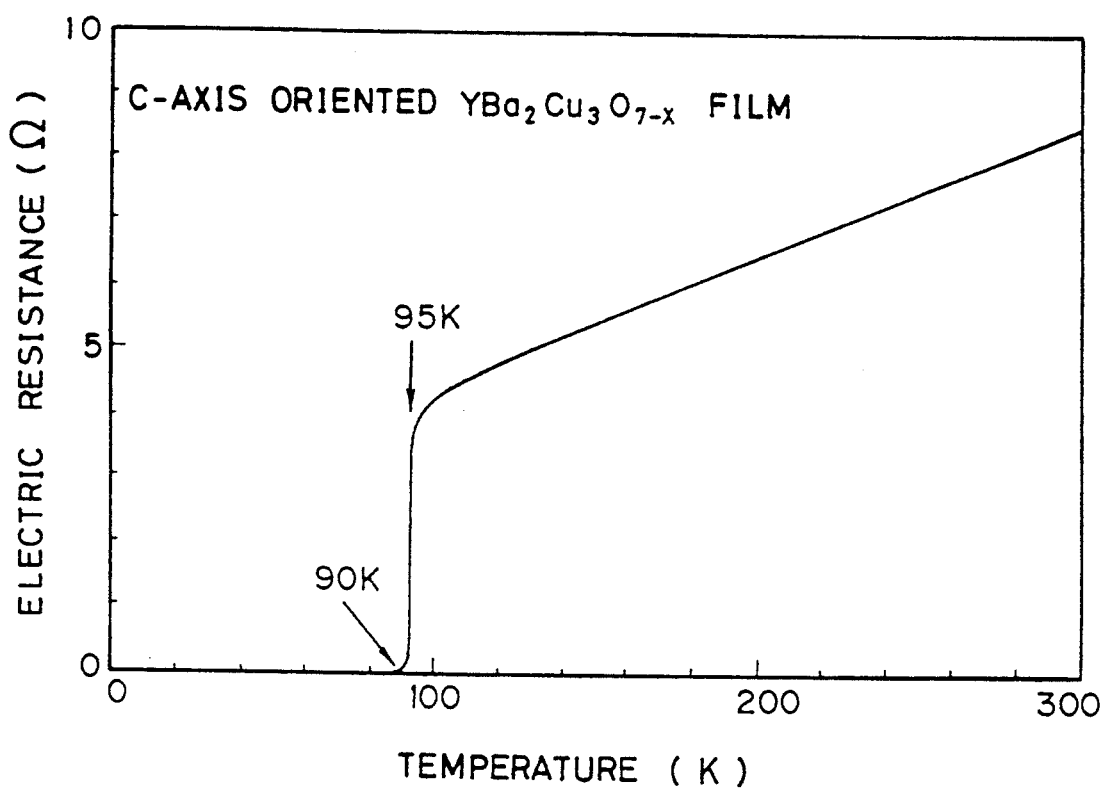
FIG. 9 shows an electrical resistance versus temperature curve for the sample which is shown in FIG. 8.

FIG. 9 shows electrical resistance of the film as measured by a conventional four-probe technique. The onset temperature was 95 K and the zero resistance temperature was 90 K. The results are comparable to the $T_c$ value of bulk samples.

Figure 10:
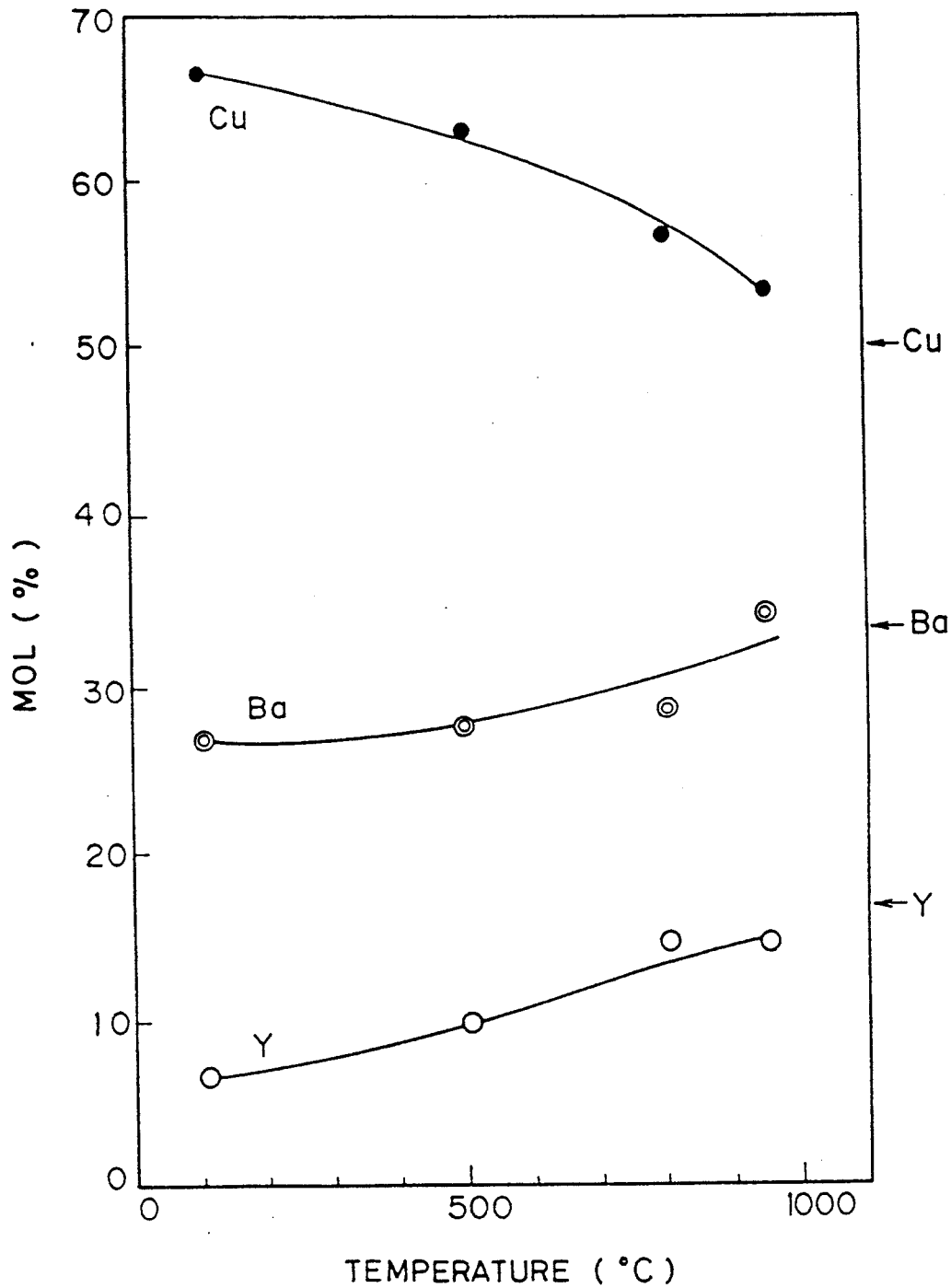
FIG. 10 shows change in composition after heat treatments.

The composition of the film was determined by X-ray fluorescence analysis. The change in the composition of the film upon heating is shown in FIG. 10, wherein the abscissa represents the treatment temperature, while the ordinate represents mole percentage.

The arrows at the right side of the figure show the mole percentage of a superconducting phase of $YBa_2Cu_3O_{7-x}$ (Y: 16.7 mole %, Ba: 33.3 mole %, Cu: 50.05 mole %).

Although the starting composition of the compound was chosen to be located on the Cu-rich and Y-poor side, the Cu content decreased remarkably during the heat treatment when the temperature is increased. Therefore, consequently, Ba and Y contents increased relatively and approached a 1-2-3 composition as indicated by the arrows. As a result, it was found that the composition deviation of the starting compound toward the Cu-rich side from the 1-2-3 composition is naturally corrected by heating, and a Cu-rich starting composition can provide a strongly c-axis-oriented film on a ceramic substrate. The reason why the c-axis orientation can be achieved from the Cu-rich starting composition is not yet clear. However, the melting points of CuO, BaO and $Y_2O_3$ are known to be 1232° C., 1923° C. and 2440° C., respectively. Therefore, it can be expected that the element which shows the lowest melting point, CuO, fist reacts at a low temperature and then a rearrangement of atoms results in the orientation.

Figure 11:
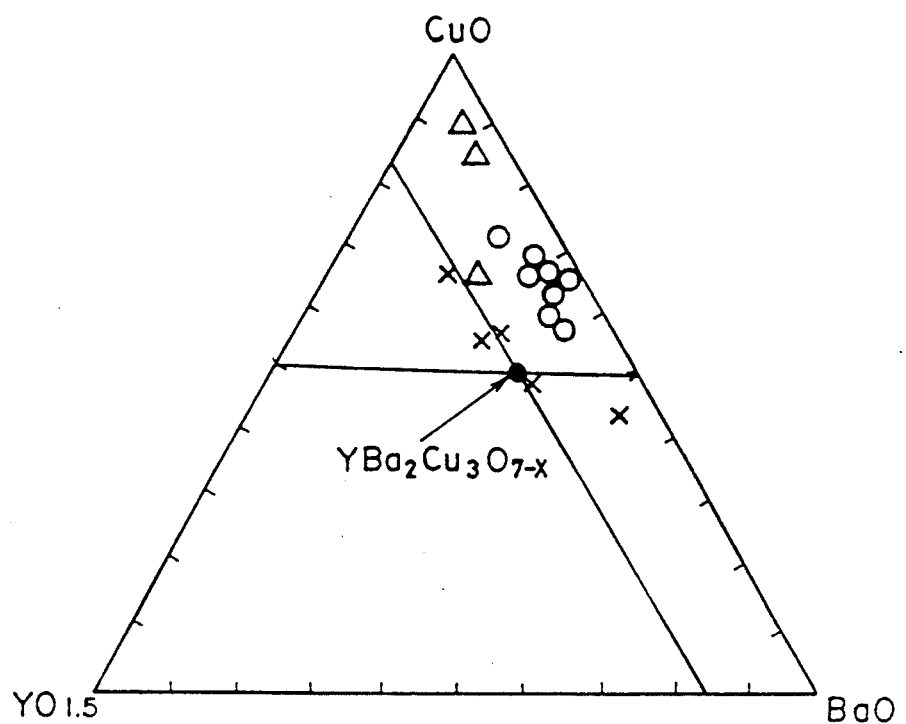
FIG. 11 shows compositions of the starting Y-Ba-Cu-O compounds made by the sol-gel method in accordance with the present invention.

Compositions of the starting Y-Ba-Cu-O compounds (made from alkoxides) are plotted in a ternary system graph in FIG. 11. Sintering was carried out at 950° C. for 30 minutes.

Figure 12:
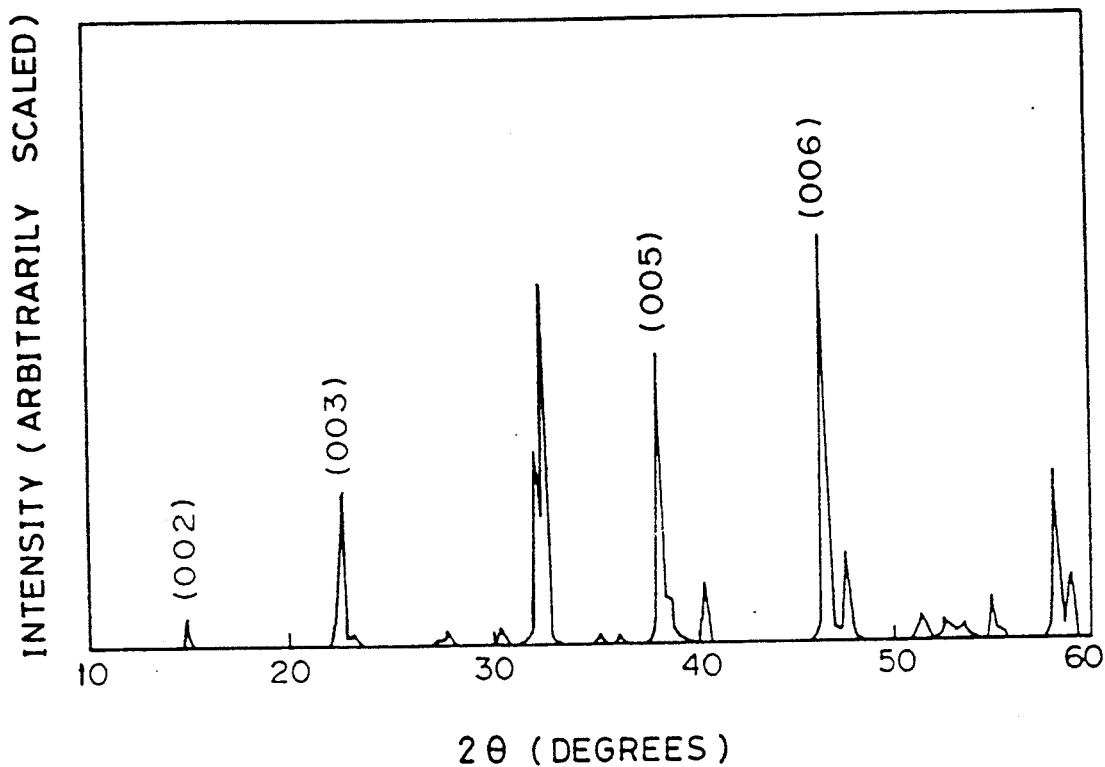
FIG. 12 shows an X-ray diffraction pattern for a partially oriented sample.

Circles in this figure show a highly oriented sample as shown in the X-ray diffraction pattern in FIG. 8. Triangles show a partially oriented sample as shown in the X-ray diffraction pattern in FIG. 12. The crosses stand for a non-oriented sample. The 1-2-3 starting composition, which is shown as closed circles in FIG. 11, gave a non-oriented sample. It can be confirmed from FIG. 11 that suitable starting compositions for the orientation are those having less than 16.6 mole % Y and more than 50 mole % Cu.

Figure 13:
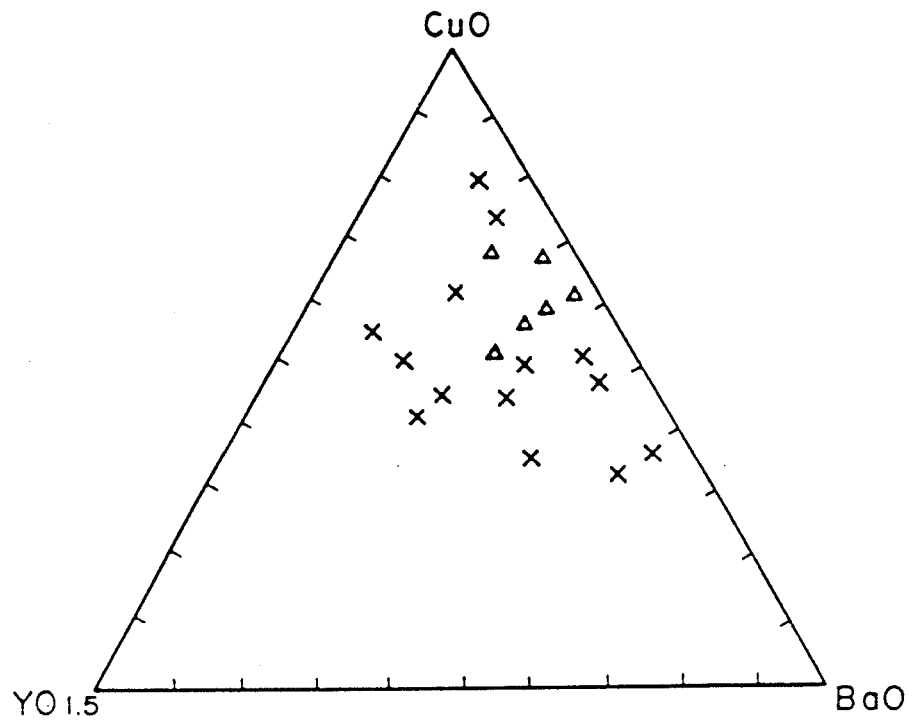
FIG. 13 shows compositions of the starting Y-Ba-Cu-O mixtures of commercially available powder reagents.

The above-mentioned phenomenon is expected to be notable when a film is formed from fine oxide particles having less than submicron size, such particles being made by the sol-gel method as in this example. The smaller the particle size, the higher the activity of the particles, and hence the lower the temperature at which migration of atoms becomes possible. In order to demonstrate this hypothesis through an experiment, the same orientation experiment by heating was carried out using commercially available reagents, such as $Y_2O_3$, $BaCO_3$ and CuO, of large particle sizes (1 to several μm) as starting materials. Since a higher temperature is necessary for achieving an orientation in such reagents having large particle sizes, the temperature was set at 1000° C. for 30 minutes. In the preliminary experiments using commercially available reagents, it was confirmed that no clear orientation can be observed when the heating is lower than 1000° C., and when higher than 1000° C., reaction of the superconduction oxide film with the substrate is so severe that the superconductor is damaged. In FIG. 13, the starting compositions of commercially available reagents are shown with the degree of c-axis orientation. Triangles and crosses show partially oriented and non-oriented samples, respectively.

The region which shows orientation is slightly narrower than that in FIG. 11 (in the case of sol-gel powder) and the degree of orientation is lower. Consequently, fine particles prepared by the sol-gel method are more suitable than the commercially available reagents in terms of orientation.

EXAMPLE 11

Figure 14:
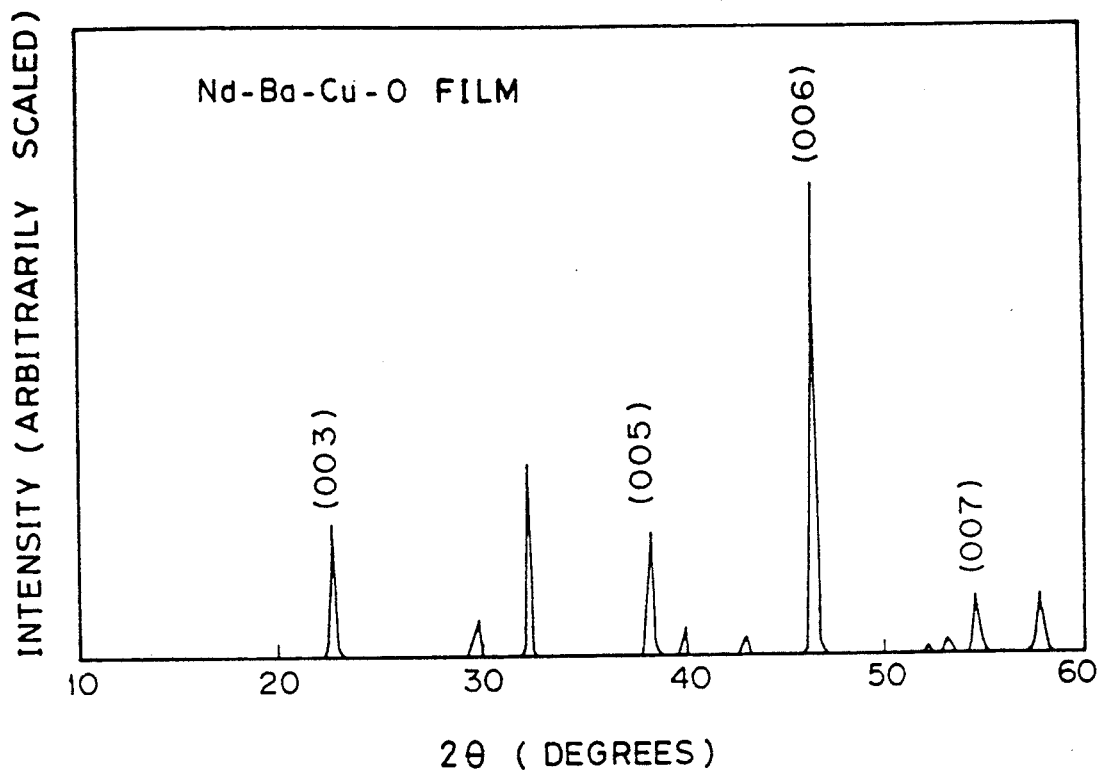
FIG. 14 shows an X-ray diffraction pattern for a c-axis-oriented Nd-Ba-Cu-O film sample.

A copper alkoxide, $Cu(OC_2H_5)_2$, a barium alkoxide, $Ba(OC_4H_9)_2$, and neodymium alkoxide, $Nd(OC_4H_9)_3$ were mixed together in such a ratio as will give a Cu-rich and Nd-poor composition oxide (Cu: 60.2 mole %, Ba: 30.8 mole %, Nd: 9.0 mole %) and were added into n-butanol as a solvent. The same procedures of reflux and hydrolysis as in example 10 were carried out. The resultant solution was condensed to have a suitable viscosity for screen printing or spray coating techniques. The films were formed on YSZ substrates by these techniques. The film on a YSZ substrate was heated at 950° C. for 30 minutes in flowing oxygen gas, and then slowly cooled to room temperature. The X-ray diffraction pattern for the thus-obtained Nd-Ba-Cu-O film is shown in FIG. 14.

Although no peaks assigned to (002) and (004) were observed, other peaks corresponding to (OON) (N=3, 5, 6, 7) appeared with high intensities. Thus, it was also confirmed that, for a Nd-Ba-Cu-O system, c-axis orientation can be performed when a starting compound with a Cu-rich and Nd-poor composition is used.

EXAMPLE 12

Figure 15:
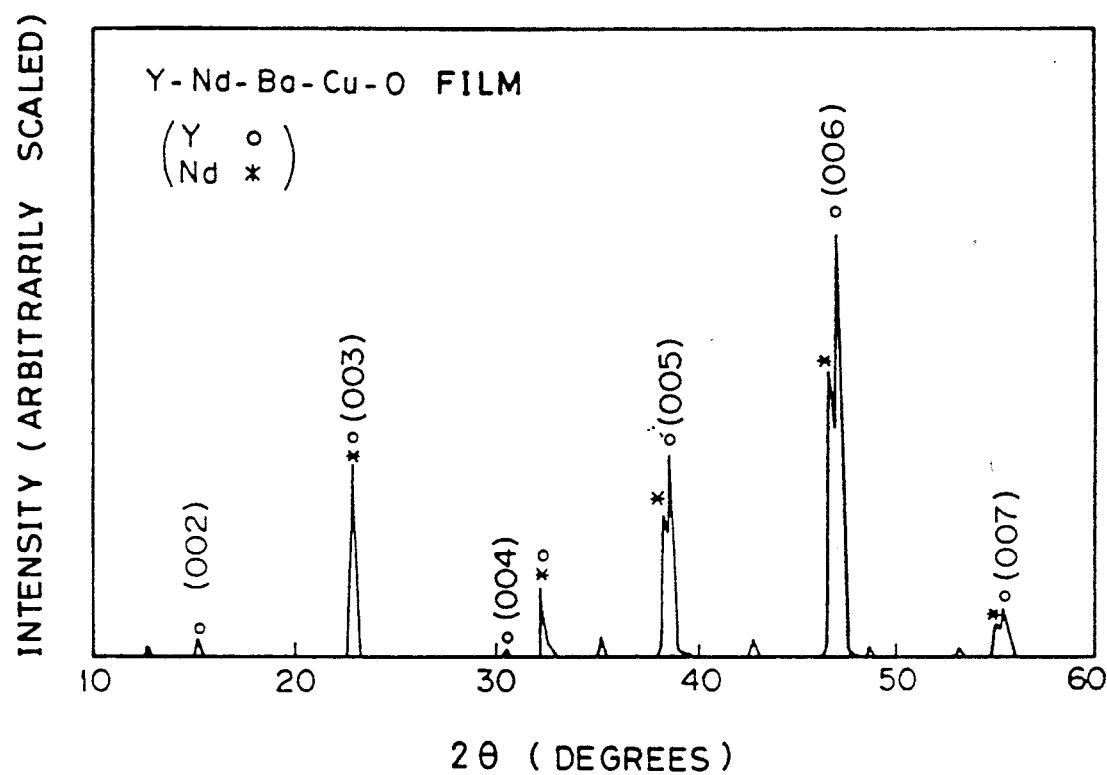
FIG. 15 shows an X-ray diffraction pattern for a c-axis-oriented Y-Nd-Ba-Cu-O film sample.

A Y-Nd-Ba-Cu-O superconducting film was produced from alkoxides as starting materials on a YSZ substrate in a manner similar to examples 10 and 11. The starting composition was 7.8 mole % Y, 5.3 mole % Nd, 17.9 mole % Ba, and 69 mole % Cu; i.e., a Cu-rich and Y, Nd-poor composition. The X-ray diffraction pattern for the Y-Nd-Ba-Cu-O superconducting film sample is shown in FIG. 15.

Peaks peculiar to c-axis orientation were observed. Furthermore, since the ionic radii of Y and Nd are different from each other (Y: 1.06 Å and Nd: 1.15 Å), the lattice constants are also different (lattice constant: Y<Nd, 2Θ: Y>Nd), and the peaks corresponding to (005), (006) and (007) for Y and Nd appeared separately. In the figure, circles and stars stand for the peaks for Y and Nd, respectively.

Consequently, it is found that film of an Ln-Ba-Cu-O (Ln: lanthanoid) system and a mixed system can also be c-axis-oriented when a suitable starting composition is chosen.

Although the shape of the substrate in the examples is plate-like, the present invention can also be applied to variously shaped substrates. For example, since ceramics, such as YSZ, are known to show superplasticity, fiber or other shapes can be produced.

EXAMPLE 13

A Y-Ba-Cu-O powder was prepared by the sol-gel method and mixed with ethylene glycol to make a paste. The paste was painted on an $Al_2O_3$ substrate and heated at 900°–950° C. for 10–30 minutes to make a superconducting film. Since an $Al_2O_3$ substrate generally tends to show a slightly higher reactivity with a superconducting material at high temperature than a YSZ substrate, the heating temperature for films on $Al_2O_3$ substrates must be a little lower than that for YSZ substrates. Nevertheless, a c-axis-oriented film was obtained from a Cu-rich and Y-poor starting composition as shown in examples 10 to 12. Therefore, it can be said that basically there is no limitation on the selection of substrates to form oriented superconducting oxides thereon.

The reactivity of substrates with a superconducting material at a high temperature, of course, depends on the material of the substrate. Through these experiments, however, it was confirmed by the inventors that it is also possible to form a c-axis-oriented film on a buffer layer, such as CuO, $Y_2O_3$, $ZrO_2$ etc., which can be prepared by, for example, using the sol-gel method.

A c-axis-oriented superconducting oxide film in the Bi-Ae-Cu-O system (where Ae is at least one alkali earth metal) can also be made in the same manner as described above.

EXAMPLE 14

Commerically available reagents of $Bi_2O_3$, $SrCO_3$, $CaCO_3$, and CuO with average particle sizes of 1 μm or more were mixed and added into ethylene glycol, and mixed again sufficiently to make a paste for painting. The paste was painted on a YSZ or an $Al_2O_3$ substrate by screen printing using a 300 mesh screen. After adequate drying, the film on the substrate was sintered at 900° C. A Bi-Sr-Ca-Cu-O film of 10 μm in thickness was obtained.

Crystal structure and the degree of orientation of the films were measured by X-ray diffraction. Electrical resistance of the films was measured by the DC four-probe technique.

Figure 16:
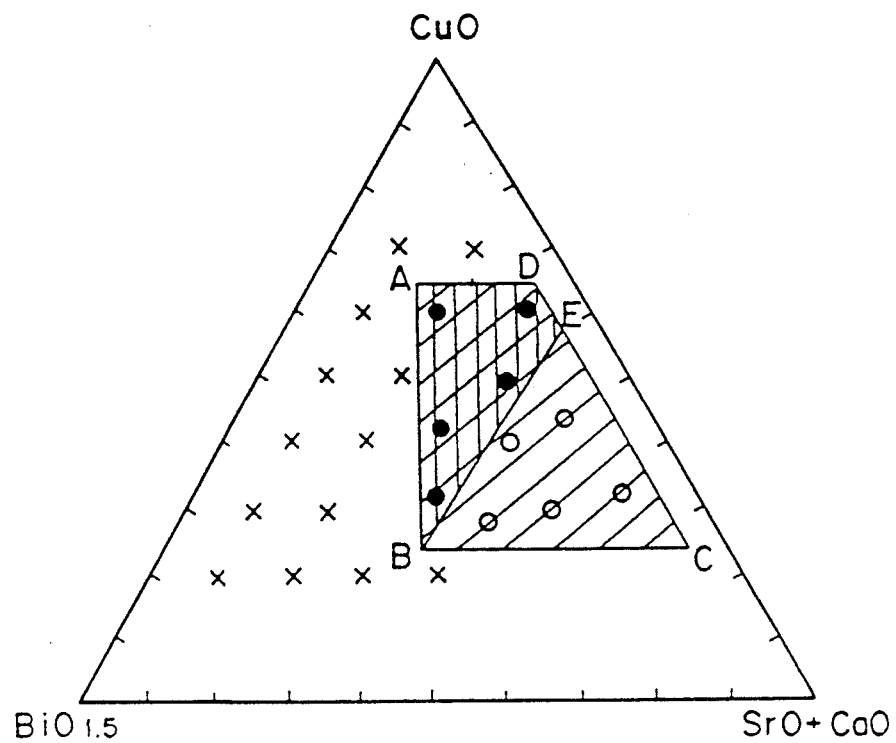
FIG. 16 shows starting composition in a Bi-Sr-Ca-Cu-O system.

Starting compositions in the Bi-(Sr, Ca)-Cu-O system (SrO/CaO+SrO)=0.5) are shown in FIG. 16. Closed and open circles show the samples of superconducting phase, and crosses show non-superconducting samples. The closed circles stand for c-axis-oriented superconducting samples. Thus, in FIG. 16, the area surrounded by A-B-C-D lines (Bi/(Cu+Sr+Ca+Bi)=4 to 40 mole %, (Sr+Ca)/(Cu+Sr+Ca+Bi)=15 to 70 mole % Cu/(Cu+Sr+Ca+Bi)=24 to 64 mole %) is the region where a superconducting phase of $Bi_2(Sr, Ca)_3Cu_2O_x$ appeared. Particularly, the region surrounded by A-B-E-D lines (Bi/(Cu+Sr+Ca+Bi)=5 to 40 mole %, (Sr+Ca)/(Cu+Sr+Ca+Bi)=15 to 40 mole %, Cu/(Cu+Sr+Ca+Bi)=24 to 64 mole %) shows the area where c-axis-oriented film samples were obtained. When the ratio of SrO/(CaO+SrO)=0.25 to 0.75, c-axis-oriented samples were also obtained.

Figure 17:
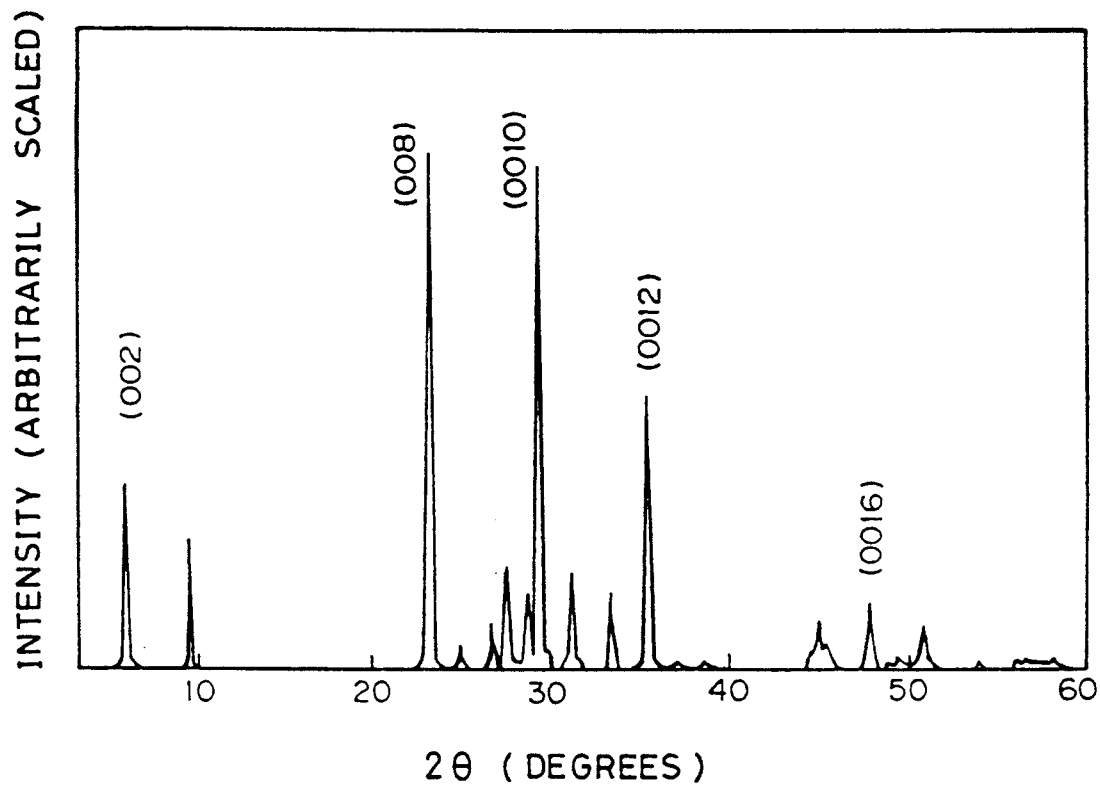
FIG. 17 shows an X-ray diffraction pattern for an oriented $Bi_2(Sr, Ca)_3Cu_2O_x$ film sample in accordance with the present invention.

The X-ray diffraction pattern of the film made from the starting composition in the region surrounded by A-B-E-D lines is shown in FIG. 17. Strong diffraction peaks, which are assigned to OON) of $Bi_2(Sr, Ca)_3Cu_2O_x$ (c-axis length: 30.6Å), are observed in this pattern. This indicates c-axis orientation perpendicular to the substrate.

Figure 18:
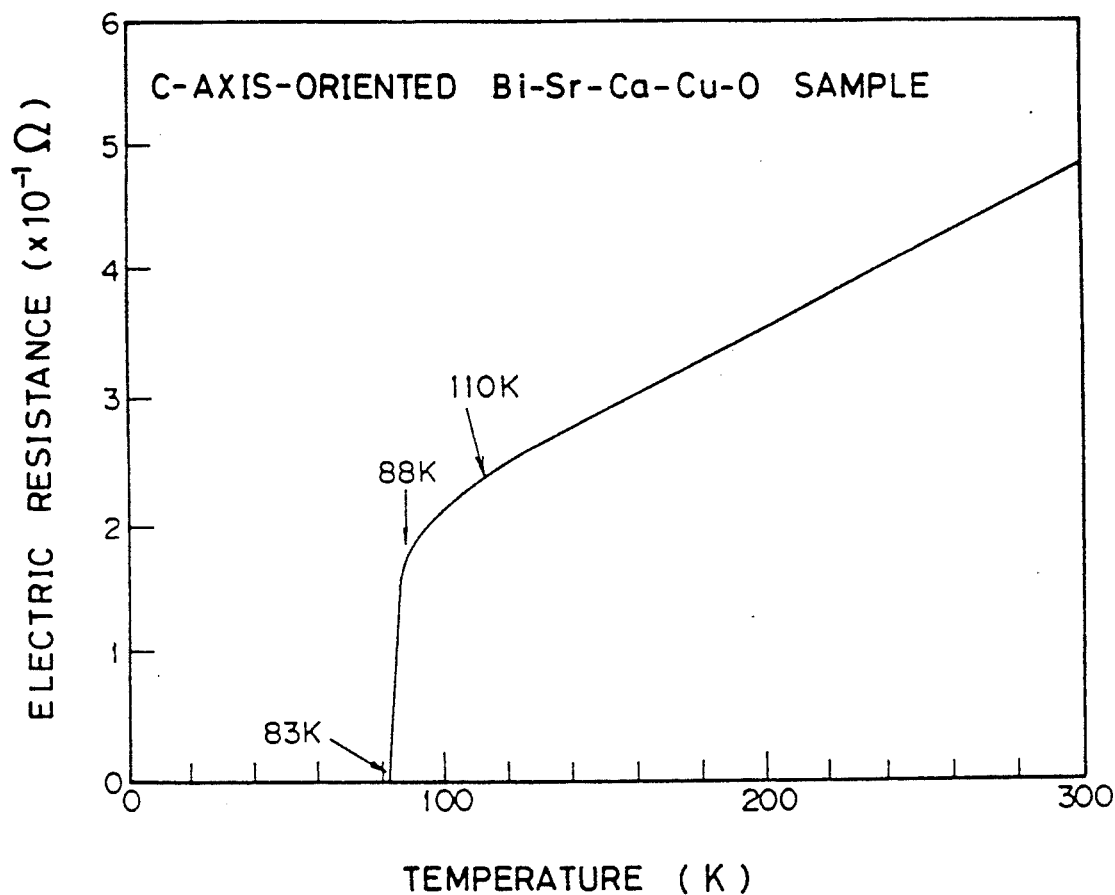
FIG. 18 shows an electrical resistance versus temperature curve for a c-axis-oriented Bi-Sr-Ca-Cu-O sample.

An electrical resistance versus temperature curve for the oriented sample is shown in FIG. 18. The film showed a sharp transition with an onset temperature of 88 K and a zero resistance temperature of 83 K.

Although the reason why c-axis orientation occurs in the composition region surrounded by A-B-E-D lines in FIG. 16 is not yet clear, it can be presumed that partial melting is also attributed to the orientation, because the region is located in the Cu and Bi-rich side (elements having low melting points in the system).

EXAMPLE 15

Alkoxides were used as the starting materials to make a superconducting film as in example 14. $Bi(OC_4H_9)_3$, $Sr(OC_4H_9)_2$, $Ca(OC_3H_7)_2$ and $Cu(OC_3H_7)_2$, in respective n-butanol solution were mixed and hydrolyzed, followed by refluxing for 10 hours to form fine oxide particles. The solvent was evaporated to make a paste. The paste was screen-printed on a YSZ substrate and after drying was sintered at 850° C. A Bi-Sr-Ca-Cu-O superconducting oxide film was obtained.

Figure 19:
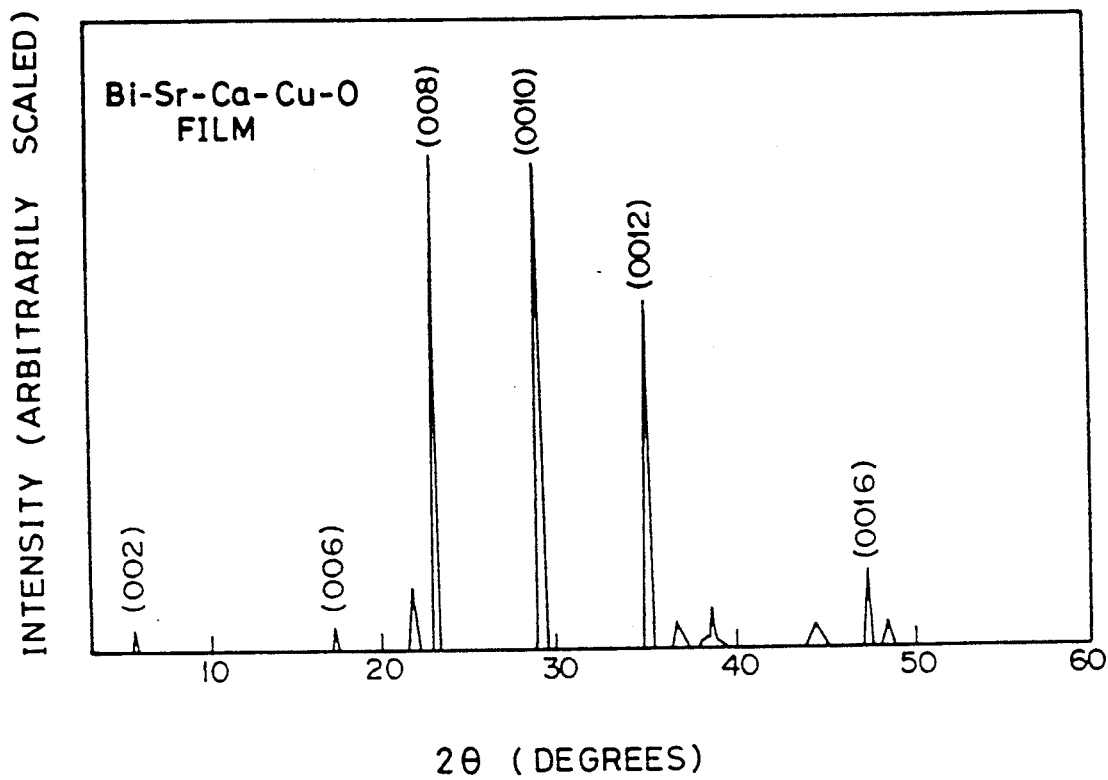
FIG. 19 shows an X-ray diffraction pattern for a highly oriented $Bi_2(Sr, Ca)_3Cu_2O_x$ film sample.

In using alkoxides as starting materials, the superconducting phase of $Bi_2(Sr, Ca)_3Cu_2O_x$ also appeared in the composition region surrounded by A-B-C-D lines and c-axis orientation was also observed in the samples whose compositions belong within the region surrounded by A-B-E-D lines in FIG. 16. The X-ray diffraction pattern for the oriented film whose starting composition is within the region surrounded by A-B-E-D lines is shown in FIG. 19. The degree of orientation of the film is higher than that of the sample in FIG. 17, that is, of the sample prepared by using commercially available reagents. The oneset temperature and the zero resistance temperature were 88 K and 87 K, respectively. The transition from the normal to the superconducting phase was very sharp.

Thus, using alkoxides as the starting materials, high quality films with a high degree of orientation can be produced as compared with using commercially available reagents.

EXAMPLE 16

A superconducting film in the Bi-based system was formed on a zirconia-coated silicon substrate.

A silicon wafer with a polished surface was used for the substrate. A starting sol for the zirconia coating was prepared from a zirconium alkoxide, $Zr(n-OC_4H_9)_4$, diluted with isopropanol. A small amount of acetic acid was also added to the starting sol. The silicon wafer was dipped into the sol and pulled up at a constant rate. The coated substrate was dried in air and sintered at 900° C. in an oxygen atmosphere. The procedures from dipping to sintering were repeated 50 times to obtain a zirconia-coated silicon substrate. A Bi-Sr-Ca-Cu-O paste, in the composition region A-B-E-D, was prepared by alkoxide hydrolysis and was screen-printed on the zirconia-coated silicon substrate, and sintered at 875° C. in an oxygen atmosphere.

The crystal structures of the zirconia-coated substrate and the sintered Bi-Sr-Ca-Cu-O film were identified by X-ray diffraction and the resistance versus temperature curve of the oxide film was measured by the DC four-probe technique.

The surface of the zirconia coating was very smooth by optical observation and the film had a high homogeneity. The film thickness was measured by X-ray diffraction and was 2.5 μm.

The X-ray diffraction pattern of the sintered Bi-Sr-Ca-Cu-O film showed formation of a c-axis-oriented $Bi_2(Sr, Ca)_3Cu_2O_x$ phase. The onset and zero resistance temperatures of the film were 88 K and 80 K, respectively, with a transition temperature width of 8 K.

Although the screen printing technique was used in the example, various techniques, such as spray coating etc., can be applied to make a superconducting film. And, while in the example, zirconia-coated silicon was used for the substrate, materials for the substrates and buffer layer are not limited so long as they have a low reactivity with the superconducting oxide formed in the sintering process.

Processes for preparing a c-axis-oriented bulk sample will be described below. By using a pressing technique on the superconducting oxides, a bulk sample which is c-axis-oriented parallel to the pressing direction can be produced.

EXAMPLE 17

Reagents $Y_2O_3$, $BaCO_3$ and CuO were mixed to make two types of compounds with different compositions; one is Y:Ba:Cu=1:2:3 (called a 1-2-3 composition) of Y=16.7 mole %, Ba=33.3 mole %, and Cu=50.0 mole %, and the other is a composition of Y=8 mole %, Ba=30 mole %, and Cu=62 mole % (called an orientation composition). The mixtures were pre-sintered at 950° C. for 5 hours in an oxygen atmosphere and ground to make powder samples.

Figure 20A:
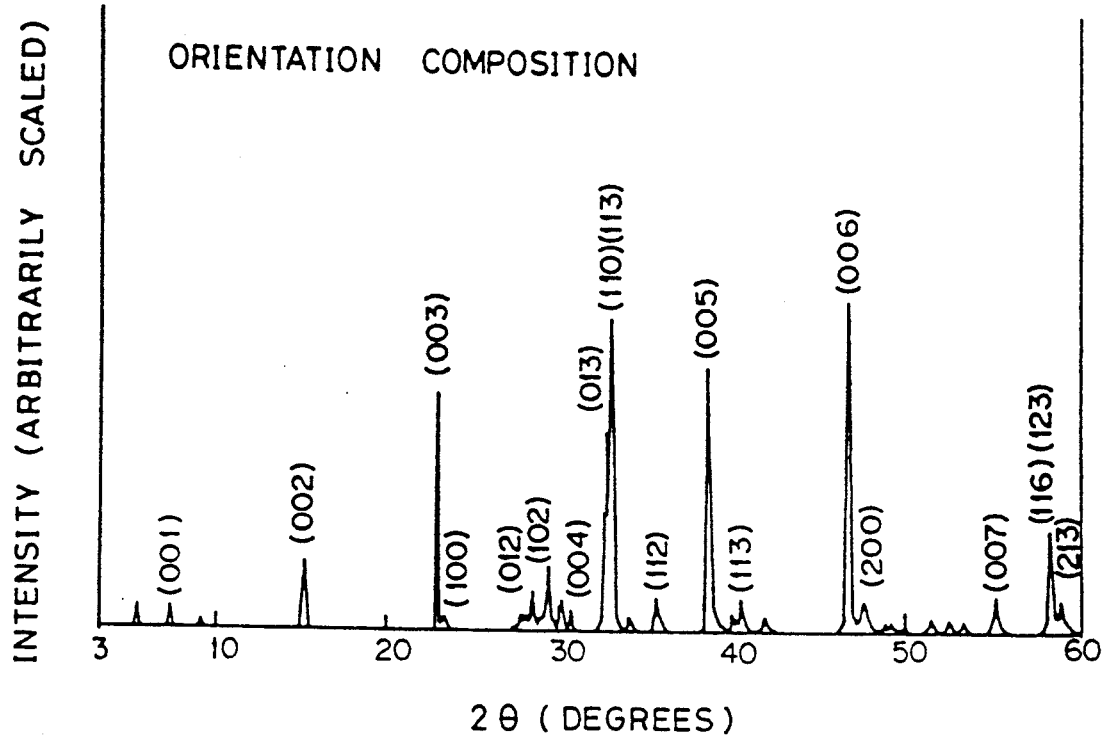
FIGS. 20A and 20B show X-ray diffraction patterns for the powder samples made from the orientation composition and the 1-2-3 composition, respectively.
Figure 20B:
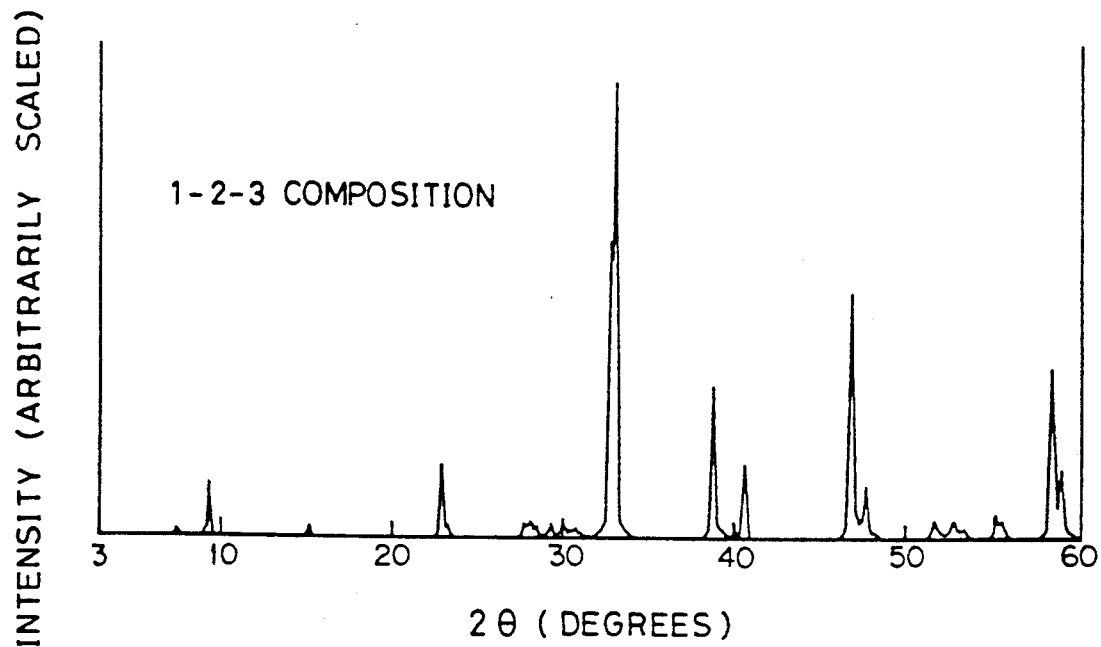

X-ray diffraction patterns for samples of the orientation composition and the 1-2-3 composition are shown in FIG. 20. The degree of orientation can be estimated roughly by comparing intensities of the (OON) peaks (N is an integer) and the other peaks, for example, (006), (110), and (103). The peak ratio of R=(006)/(110)(103) were 1.06 for the sample of the orientation composition and 0.52 for that of the 1-2-3 composition.

Figure 21:
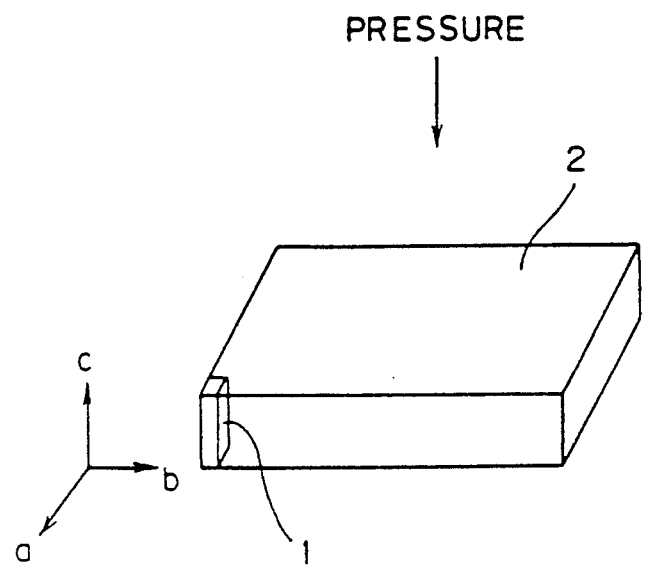
FIG. 21 is a schematic view illustrating c-axis orienting by pressing.
Figure 22:
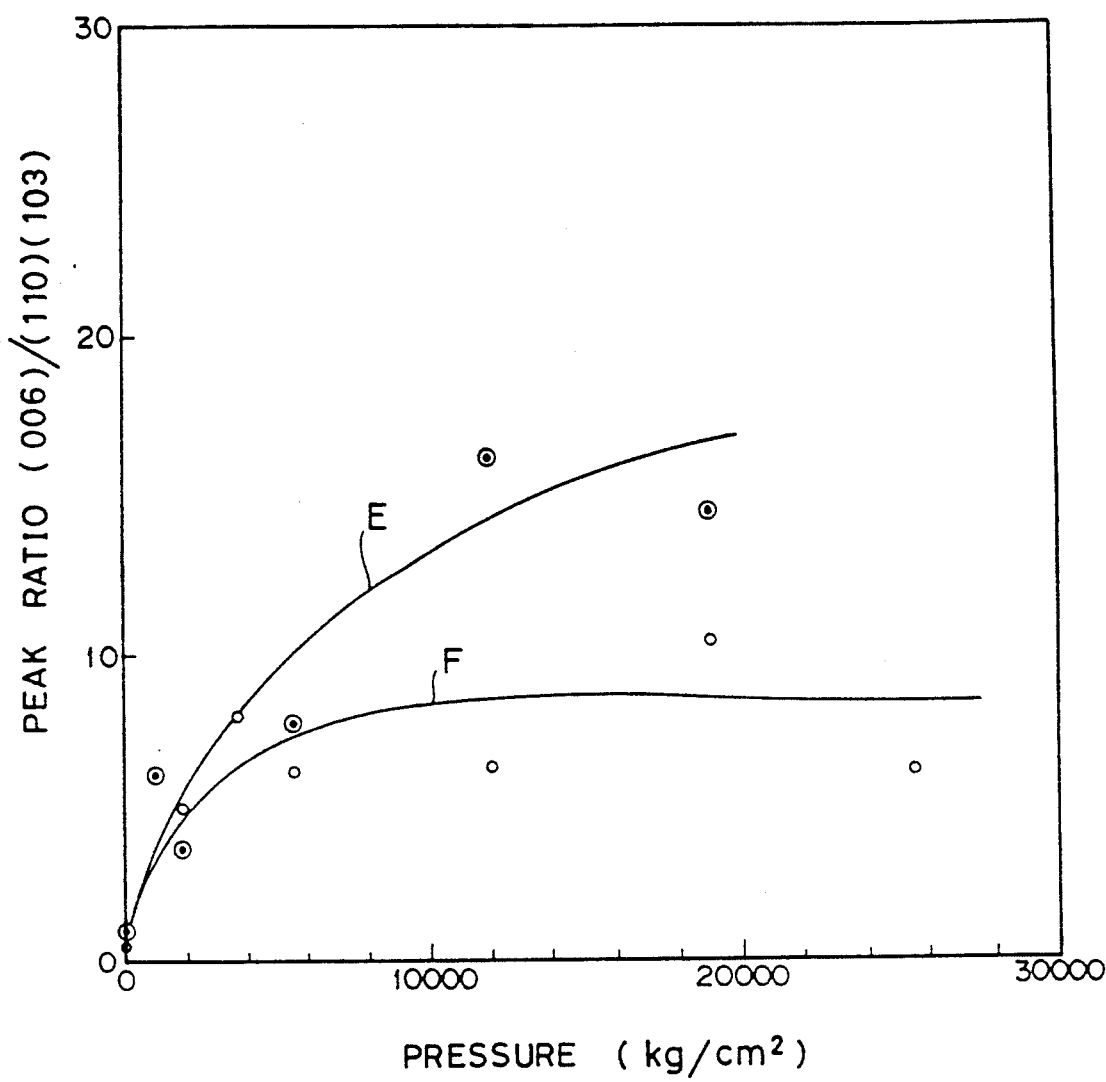
FIG. 22 shows the relationship between the degree of c-axis orientation (peak ratio of (006)/(110)(103)) and the applied pressure.

The two kinds of composition powders were pressed into pellets with various pressures and examined by X-ray diffraction. The direction of the pressure is parallel with the c-axis as shown in FIG. 21. In FIG. 22, the degree of the orientation (estimated by the (006)/(110)(103) peak ratio) are plotted against applied pressure. Curve E shows the peak ratios for the pellet samples made from the powder with the orientation composition, and curve F shows those for the sample from the powder with the 1-2-3 composition. The powder with the orientation composition shows higher orientation than that with the 1-2-3 composition.

The powder sample with the orientation composition contains a large amount of plate-like crystals which can be easily oriented by pressing. Thus, after pressing, the sample shows an excellent degree of orientation.

As shown schematically in FIG. 21, since a unit cell 1 with a, b, and c axes (a=3.8181 Å, b=3.888 Å, c=11.688 Å) forms a plate-like crystal 2, these plate-like crystals are easily arranged by pressing to stabilize them against applied pressure.

EXAMPLE 18

Figure 23:
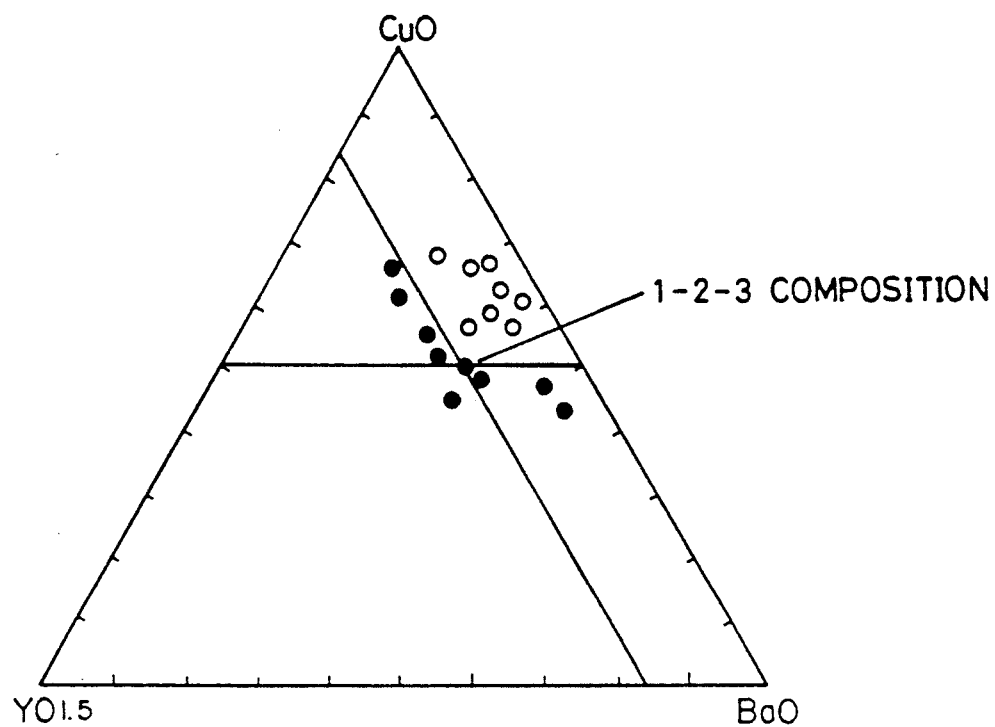
FIG. 23 shows the compositions from which high orientation is easily obtained by pressing.

In the Y-Ba-Cu-O system, compositions were changed to attain a high orientation by pressing. Mixtures of the reagents were sintered at 950° C. in an oxygen atmosphere (the same conditions as in the example 17). Pellets were made by pressing at 19000 kg/cm². The results are shown in FIG. 23. In the ternary system graph, open circles stand for the samples which show the same order of orientation as that of the orientation composition, and closed circles stand for the samples which show the same order or less of orientation as that of the 1-2-3 composition. The composition region of open circles (high orientation region) agrees well with that in the oriented film (see FIG. 11). The high orientation region is Y/(Y+Ba+Cu)<16.6 mole % and Cu/(Y+Ba+Cu)>50 mole %, which is located on the Y-poor and Cu-rich side.

EXAMPLE 19

Figure 24:
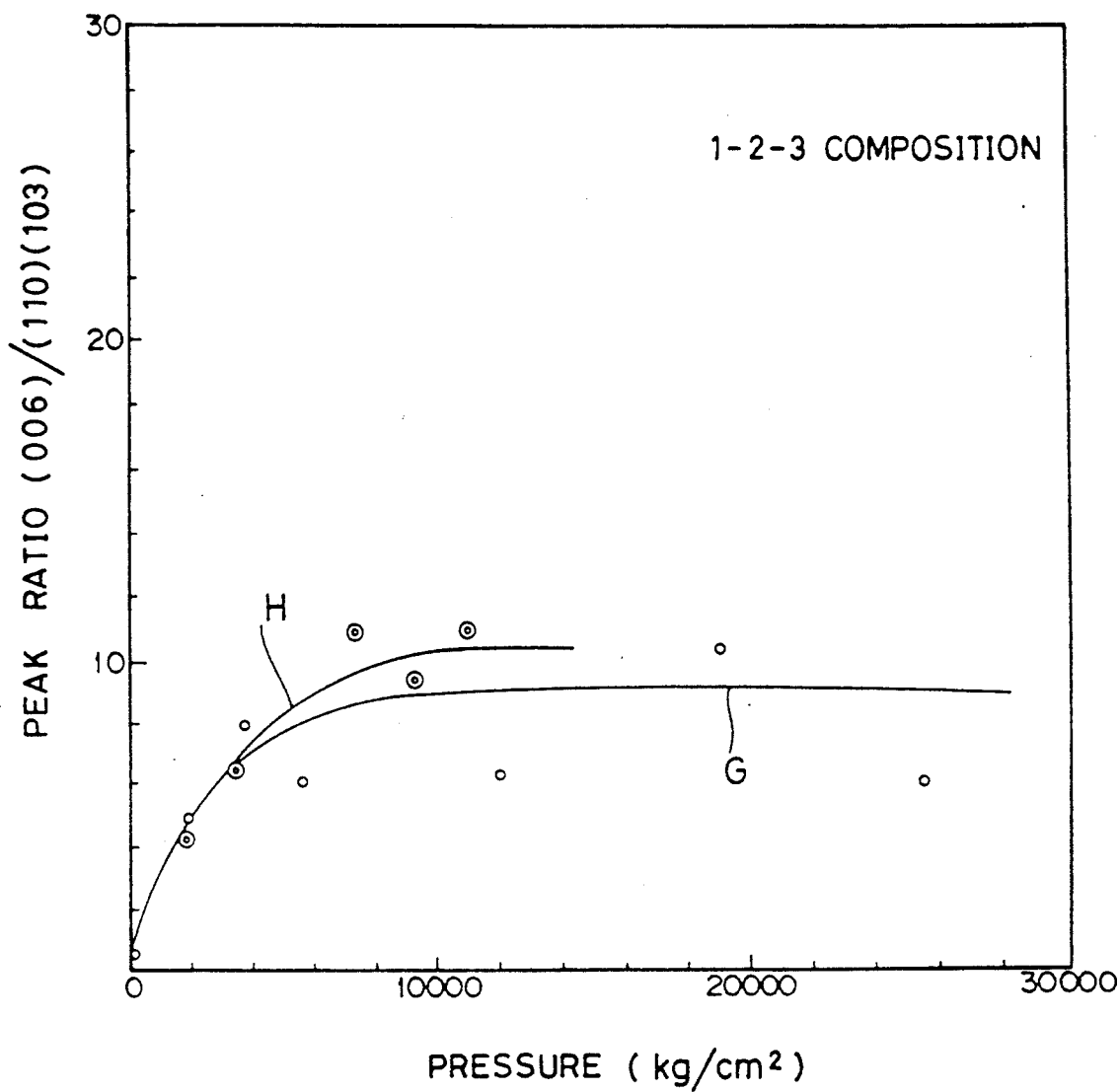
FIG. 24 shows the relationship between the orientation (peak ratio of (006)/(110)(103)) and the applied pressure.

Powder samples with the 1-2-3 composition were pressed into pellets at various pressures and were resintered at 875° C. for 40 hours in an oxygen atmosphere. The pellets were checked by X-ray diffraction. The peak ratios of (006)/(110)(103) in the 1-2-3 composition samples were plotted against pressures used in the pressing process in FIG. 24. Curve G shows the degree of orientation for the samples subjected to only pressing, and curve H those for the samples subjected to pressing and re-sintering at 875° C. No noticeable change in the degree of orientation was observed after resintering at that temperature. Although the results in the samples with the orientation composition are not shown here, almost the same results are obtained; i.e., no decrease was observed after re-sintering at 875° C.

Electrical resistance of the re-sintered pellet samples were measured by a conventional four-probe technique. The onset temperature was 93 K, and the zero resistance temperature was 90 K.

In this example, re-sintering was carried out to ensure mechanical strength against thermal shock in this measurement.

EXAMPLE 20

A copper alkoxide, $Cu(i-OC_3H_7)_2$ in isopropanol, a barium alkoxide, $Ba(n-OC_4H_9)_2$ in butanol, and a yttrium alkoxide, $Y(n-OC_4H_9)_3$ in butanol were mixed in such a ratio as to give an oxide with the composition, 60 mole % Cu, 30 mole % Ba, and 10 mole % Y.

The resultant mixed solution was refluxed for 20 hours, and pure water in an amount of about 5 to 20 times the total molar amount of Cu, Ba and Y was titrated into the solution with ultrasonic vibration. Then, the solution was refluxed again for about 10 hours to ensure complete hydrolysis. The solvent in the solution was evaporated at 120°-150° C. for 2 or 3 days. The dried sample was sintered at 900° C. for 5 hours in an oxygen atmosphere.

The sintered sample was ground into powder, pressed, and examined by X-ray diffraction. As a result, c-axis oriented samples of R=(006)/(110)(103)=from 1.55 to 4 were obtained, which degree of orientation was higher than that of the sample made from commercially available reagents (R=1.06).

Figure 25:
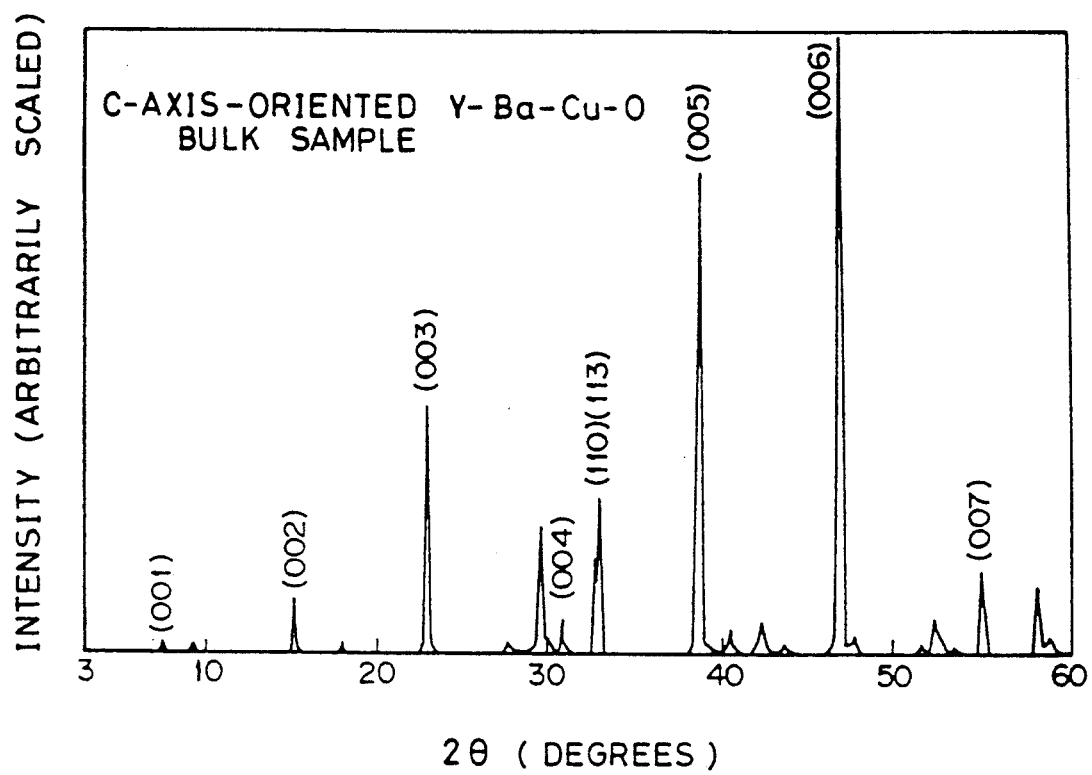
FIG. 25 shows an X-ray diffraction pattern for a powder sample prepared from alkoxides.

An X-ray diffraction pattern for the powder sample of R =4 obtained in the above-mentioned manner is shown in FIG. 25.

EXAMPLE 21

Reagents $Bi_2O_3$, $SrCO_3$, $CaCO_3$, and CuO were mixed to make various compositions, respectively shown by open circles, closed circles and crosses in FIG. 16, and pre-sintered at 875° C. for 10 hours in a platinum boat in an oxygen atmosphere. The sintered samples were ground into powders. Then, using a pressing plate, the powders were pressed on the sample plate by a vertical pressure of 1 kg/cm² or less and X-ray diffraction patterns (CuKa) were measured.

The compositions in the region surrounded by B-C-E lines in FIG. 16 showed superconducting phases but did not show a high orientation.

Figure 26:
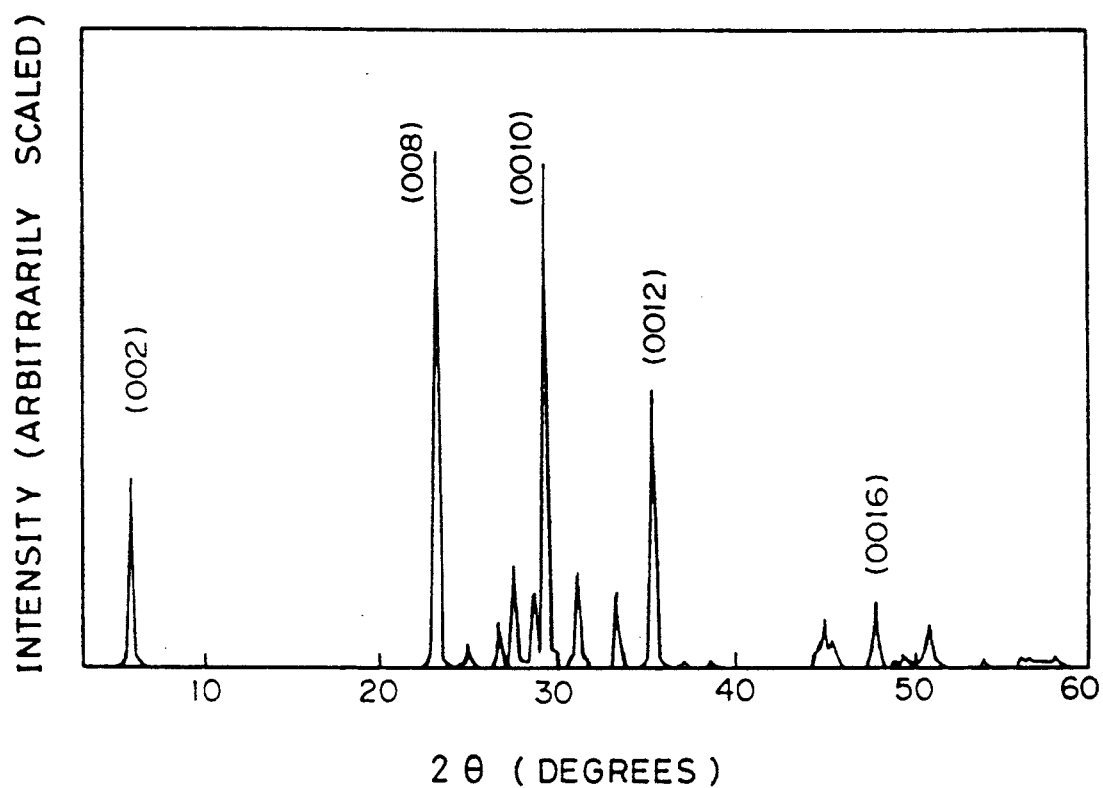
FIG. 26 shows an X-ray diffraction pattern for a c-axis-oriented $BiSrCaCu_3O_x$ powder sample.

An X-ray diffraction pattern for the sample of $BiSrCaCu_3O_x$ is shown in FIG. 26. In this diffraction pattern, (OON) peaks show higher intensities than the other peaks even at a pressure of 1 kg/cm² or less. Thus, the composition $BiSrCaCu_3O_x$ has a tendency to be highly c-axis oriented. In this diffraction pattern, the strong peak appeared at 2Θ=5.8°. The 5.8° peak is commonly observed in compositions within the region surrounded by A-B-E-D lines. The samples which are shown as closed circles in FIG. 16, the composition region surrounded by A-B-E-D lines, also show superconductivity and a high orientation in making an oriented bulk sample by pressing. However, in the compositions indicated by crosses no peak appeared at $2\Theta=5.8°$. Hence these compositions are not in a superconducting phase.

In the cases of composition SrO:CaO=1.3 and SrO:CaO=3:1, the obtained results were similar to that described above.

An adequate amount of propylene glycol was added to the mixed and not pre-sintered powders having various compositions shown in FIG. 16 to make pastes. Resultant pastes were coated on YSZ substrates and examined by X-ray diffraction. As shown in example 14, the samples with compositions in the region surrounded by A-B-E-D lines showed a high orientation when films were made from them. Accordingly, it can be said that the compositions surrounded by A-B-D-E lines, compositions which are Cu or Bi-rich, are suitable for making a c-axis oriented sample in both film and bulk form.

EXAMPLE 22

Reagents $Bi_2O_3$, $SrCO_3$, $CaCO_3$, and CuO were mixed in a mole ratio of $Bi_2Sr_{1.5}Ca_{1.5}Cu_2O_x$ and pre-sintered at 875° C. for 10 hours in a platinum boat in an oxygen atmosphere. The samples were ground into powders and pressed into pellets at various pressures to examine pressure dependency of the degree of the orientation.

Figure 27A:
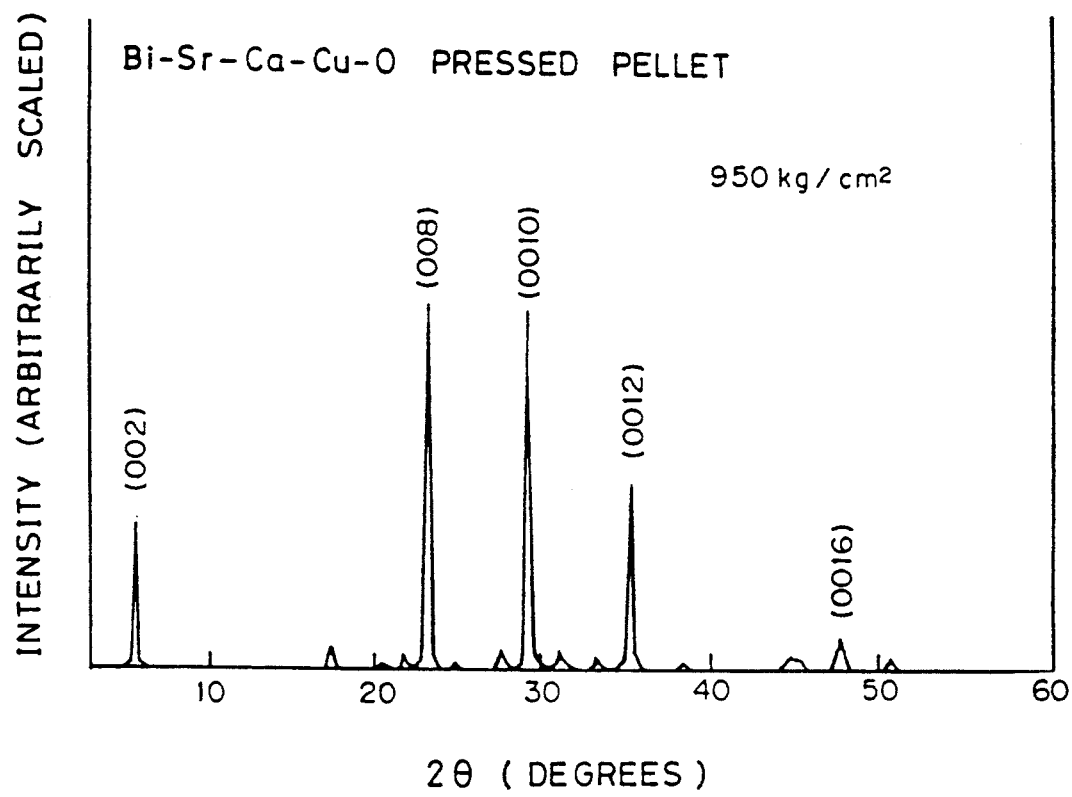
FIGS. 27A, 27B, and 27C show X-ray diffraction patterns for samples made by pressing at different pressures.
Figure 27B:
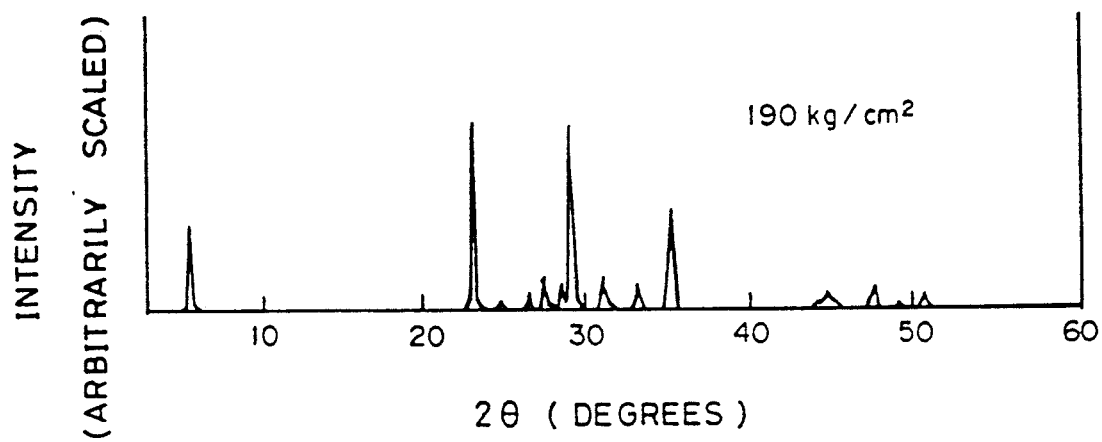
Figure 27C:
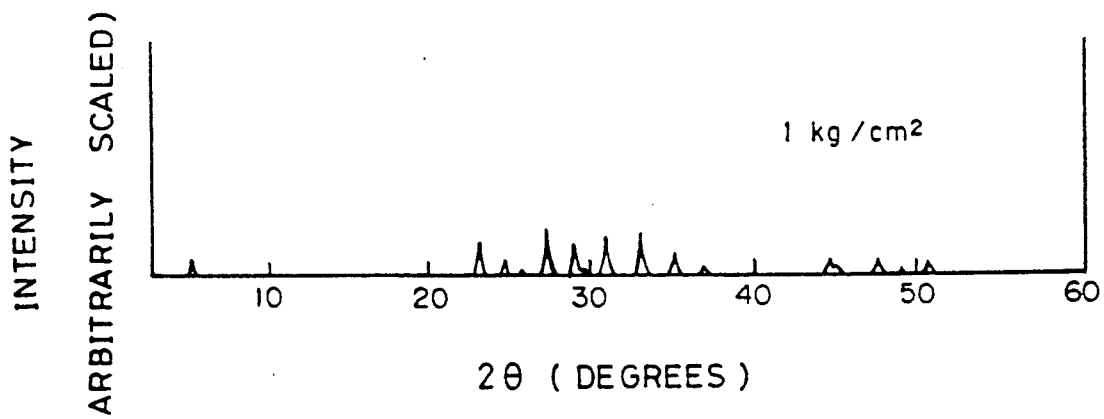

X-ray diffraction patterns for these samples are shown in FIG. 27. At a pressure of 1 kg/cm$^2$ or less, no orientation was observed. At 190 kg/cm$^2$, c-axis orientation was observed, and at 950 kg/cm$^2$ the degree of the orientation was enhanced.

Figure 28:
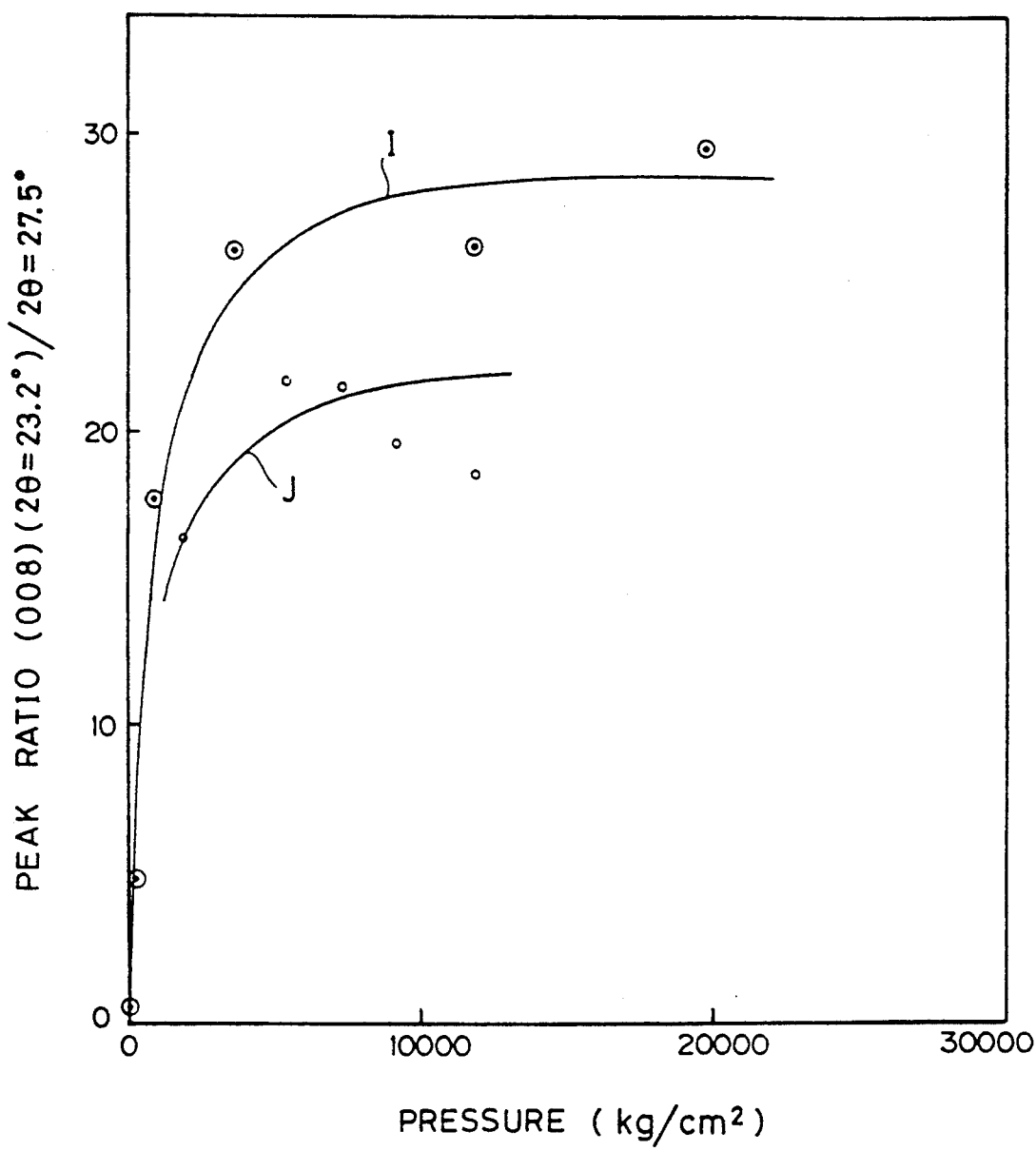
FIG. 28 shows relationships between the orientation (presented by peak ratio (008)/2Θ=27.5°) and the applied pressure.

Peak ratios of $(008)(2\Theta=23.2°)/2\Theta=27.5°$ are plotted against pressure in FIG. 28. As shown in curve I, the peak ratio increased with increasing pressure and reached a constant value 28 at 10000 kg/cm$^2$ pressure. In FIG. 28, curve J shows the peak ratio of a sample which was re-sintered at 850° C. for 40 hours in air after pressing. Sintering is often necessary for using superconducting powders. From a comparison with curve I, it is seen that, although by re-sintering the degree of orientation is slightly decreased, the pressure dependency was almost the same.

Electrical resistance versus temperature curves for these samples were similar to those in FIG. 18. The resistance decreased with decreasing temperature. At 110 K, a slight change of resistance was observed, and the onset and zero resistance temperatures were 88 K and 83 K, respectively.

The Bi-Sr-Ca-Cu-O samples are known to have two super-conducting phases of 110 K and 80 K. In this example, the sample showed a 80 K-class superconducting property.

EXAMPLE 23

Alkoxides, $Bi(n-OC_4H_9)_3$, $Sr(n-OC_4H_9)_2$, $Ca(i-OC_3H_7)_2$, and $Cu(i-OC_3H_7)_2$, were mixed in a mole ratio of Bi:Sr:Ca:Cu=2:1.5:1.5:2 in 1-butanol as solvent. The solution was refluxed for 20 hours and pure water of 5 to 10 times the total molar amount of Bi, Sr, Ca, Cu was titrated into it with ultrasonic vibration. Then, the solution was refluxed again for 10 hours to ensure complete hydrolysis. The oxide powder sample was obtained by drying the solution.

The powder was pre-sintered at 800° C. for 10 hours, and ground into powder again. The resultant powder was pressed into pellets at a pressure of 4000 kg/cm$^2$ and examined by X-ray diffraction.

The peak ratio of $2\Theta=23.2°/2\Theta=27.5$ was about 30. The degree of orientation was slightly higher than that in example 22.

POSSIBLE APPLICATIONS IN THE INDUSTRY

As described above, since fine oxide particles for superconductors are made in a liquid phase at a temperature less than the boiling point of the solvent in the processes according to present invention, a fine and homogeneous powder, which can be sintered at a low temperature, can be obtained.

By forming a buffer layer between a substrate and a superconducting film to suppress the reaction of the super-conductor with the substrate during the sintering process, materials which ordinarily cannot be used, such as silicon, silica glass or other ceramics, can be used as the substrate, and on the buffer-coated substrate, a c-axis oriented $YBa_2Cu_3O_{7-x}$ superconducting oxide film with good superconducting properties can be fabricated.

Highly c-axis oriented superconducting film and bulk products can be fabricated from the compounds with the starting compositions of Cu>50 mole % and Ln<16.6 mole % in the Ln-Ae-Cu-O system.

Highly c-axis-oriented superconducting film and bulk products can be fabricated from compounds with the starting compositions of Bi/(Bi+Ae+Cu)=5 to 40 mole %, Ae/(Bi+Ae+Cu) =15 to 70 mole %, Cu/(Bi+Ae+Cu)=24 to 64 mole %, and more preferably the starting compositions of Bi/(Bi+Ae+Cu)=5 to 40 mole %, Ae/(Bi+Ae+Cu)=15 to 40 mole %, Cu/(Bi+Ae+Cu)=24 to 64 mole %. C-axis oriented products are advantageous for superconducting film and bulk in terms of high critical current density.

We claim:

1. A process for preparing a superconducting oxide, comprising the steps of:
   a. separately dissolving in respective solvents alkoxides of a plurality of elements which constitute the superconducting oxide to provide respective alkoxide solutions;
   b. mixing the respective alkoxide solutions together to provide a mixed solution;
   c. subjecting the mixed solution to hydrolysis to provide a sol;
   d. evaporating the respective solvents from the sol to provide a concentrate;
   e. heating the concentrate at a temperature effective to provide an oxide powder;
   f. mixing the oxide powder with at least one of at least one additional oxide and at least one carbonate of elements which constitute the superconducting oxide to provide a mixed oxide powder;
   g. forming the mixed oxide powder into a continuous body; and
   h. sintering the continuous body.

2. A process for preparing a superconducting oxide, comprising the steps of:
   a. separately dissolving in respective solvents alkoxides of a plurality of elements which constitute the superconducting oxide to provide respective alkoxide solutions;
   b. mixing the respective alkoxide solutions together to provide a mixed solution;
   c. subjecting the mixed solution to hydrolysis to provide a sol;
   d. evaporating the respective solvents from the sol to provide a concentrate;

e. forming the concentrate into a continuous body; and f. sintering the continuous body;

wherein said continuous body is a film, and wherein said film is formed on a buffer layer provided on a substrate.

3. The process for preparing a superconducting oxide as claimed in claim 2, wherein the buffer layer is comprised of zirconia as at least the main constituent.

4. A process for preparing an oxide superconductor having its crystalline c-axis oriented perpendicular to a surface thereof, the process comprising:

a. separately dissolving in respective solvents alkoxides of at least one of yttrium and a lanthanoid, at least one alkaline earth metal, and copper to provide respective alkoxide solutions;

b. mixing the respective alkoxide solution together to provide a mixed solution containing an amount of alkoxide for which $Ln/(Ln+Ae+Cu) < 16.6$ mole %, $Cu/(Ln+Ae+Cu) > 50$ mole %, and $Ae/(Ln+Ae+Cu)$ = remaining mole %, wherein Ln is at least one of yttrium and a lanthanoid, and Ae is at least one alkaline earth metal;

c. subjecting the mixed solution to hydrolysis to provide a sol;

d. evaporating the respective solvent from the sol to provide a concentrate;

e. forming the concentrate into a continuous body; and f. sintering the continuous body.

5. The process for preparing an oxide superconductor as claimed in claim 4, wherein step e, forming, includes the further steps of evaporating the respective solvent from the concentrate to provide an oxide powder, sintering the oxide powder, grinding the oxide powder after sintering to provide a fine oxide powder, filling the fine oxide powder into a die, and pressing the fine oxide powder to provide the continuous body.

6. The process for preparing an oxide superconductor as claimed in claim 4, wherein step e, forming, comprises applying the concentrate onto a surface of a substrate to form a film.

7. The process for preparing an oxide superconductor as claimed in claim 4, wherein Ae is barium.

8. The process for preparing an oxide superconductor as claimed in claim 4, wherein the oxide superconductor has a composition substantially equal to $YBa_2Cu_3O_{7-x}$ in which x is a number indicating deviation from stoichiometry.

9. A process for preparing a Bi-Ae-CuO series oxide superconductor having its crystalline c-axis oriented perpendicular to a surface thereof in which Ae is at least one alkaline earth metal, the process comprising:

a. separately dissolving in respective solvents alkoxides of bismuth, at least one alkaline earth metal, and copper to provide respective alkoxide solutions;

b. mixing the respective alkoxide solutions together to provide a mixed solution containing an amount of alkoxide for which mole % of $Ae/(Bi+Ae+Cu)$ is less than the stoichiometric value of Ae of the oxide superconductor to be prepared;

c. subjecting the mixed solution to hydrolysis to provide a sol;

d. evaporating the respective solvents from the sol to provide a concentrate;

e. forming the concentrate into a continuous body; and f. sintering the continuous body.

10. The process for preparing an oxide superconductor as claimed in claim 9, wherein the mixed solution contains an amount of alkoxide for which $Bi/(Bi+Ae+Cu)=5$ to 40 mole %, $Ae/(Bi+Ae+Cu)=15$ to 40 mole %, and $Cu/(Bi+Ae+Cu)=24$ to 64 mole %.

11. The process for preparing an oxide superconductor as claimed in claim 9, wherein step e, forming, includes the further steps of evaporating the respective solvents of the concentrate to provide an oxide powder, sintering the oxide powder, grinding the oxide powder after sintering to provide a fine oxide powder, filling the fine oxide powder into a die, and pressing the fine oxide powder to provide the continuous body.

12. The process for preparing an oxide superconductor as claimed in claim 9, wherein step e, forming, comprises applying the concentrate onto a surface of a substrate to form a film.

13. The process for preparing an oxide superconductor as claimed in claim 9, wherein the at least one alkaline earth metal is strontium and calcium.

14. The process for preparing an oxide superconductor as claimed in claim 13, wherein the oxide superconductor has a composition substantially represented by $Bi_2(Sr,Ca)_3Cu_2O_x$ in which x is a number indicating deviation from stoichiometry.

* * * * *